United States Patent
Koo et al.

(10) Patent No.: US 9,443,892 B2
(45) Date of Patent: Sep. 13, 2016

(54) IMAGE SENSOR AND METHOD OF FORMING THE SAME

(71) Applicant: SAMSUNG ELECTRONICS CO., LTD., Suwon-si, Gyeonggi-do (KR)

(72) Inventors: June-mo Koo, Seoul (KR); Sang-Hoon Kim, Seongnam-si (KR); Seung-Hun Shin, Hwaswong-si (KR); Jongcheol Shin, Hwasung (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 128 days.

(21) Appl. No.: 14/182,829

(22) Filed: Feb. 18, 2014

(65) Prior Publication Data

US 2014/0239362 A1 Aug. 28, 2014

(30) Foreign Application Priority Data

Feb. 25, 2013 (KR) ......................... 10-2013-0019826

(51) Int. Cl.
*H01L 31/062* (2012.01)
*H01L 31/113* (2006.01)
*H01L 27/146* (2006.01)

(52) U.S. Cl.
CPC ..... *H01L 27/14612* (2013.01); *H01L 27/1463* (2013.01); *H01L 27/1464* (2013.01); *H01L 27/14689* (2013.01)

(58) Field of Classification Search
USPC ....... 257/294, 228, 230, 292, 432, 447, 460, 257/462
See application file for complete search history.

(56) References Cited

U.S. PATENT DOCUMENTS

| 7,518,172 | B2 | 4/2009 | Moon et al. | |
|---|---|---|---|---|
| 7,902,618 | B2 | 3/2011 | Mao et al. | |
| 8,035,178 | B2 | 10/2011 | Mori et al. | |
| 8,138,530 | B2 | 3/2012 | Park et al. | |
| 8,440,495 | B2 | 5/2013 | Liu et al. | |
| 2010/0096718 | A1* | 4/2010 | Hynecek | H01L 23/481 257/460 |
| 2010/0148289 | A1* | 6/2010 | McCarten | H01L 27/1463 257/432 |
| 2010/0237451 | A1* | 9/2010 | Murakoshi | H01L 27/1463 257/432 |
| 2010/0270636 | A1 | 10/2010 | Huang et al. | |
| 2012/0018617 | A1 | 1/2012 | Miyanami | |

(Continued)

FOREIGN PATENT DOCUMENTS

| JP | 2007-036118 | 2/2007 |
|---|---|---|
| JP | 2008-084962 | 4/2008 |
| KR | 10-2011-0049329 A | 5/2001 |

(Continued)

OTHER PUBLICATIONS

T.H. Husu et al. "Dramatic Reduction of Optical Crosstalk in Deep-Submicrometer CMOS Imager with Air Gap Guard Ring", IEEE Electron Device Letters, vol. 25, No. 6, Jun. 2004, pp. 375-377.

(Continued)

*Primary Examiner* — Errol Fernandes
(74) *Attorney, Agent, or Firm* — Lee & Morse, P.C.

(57) ABSTRACT

An image sensor includes a substrate having a first surface opposing a second surface and a plurality of pixel regions. A photoelectric converter is included in each of the pixel regions, and a gate electrode is formed on the photoelectric converter. Also, a pixel isolation region isolates adjacent pixel regions. The pixel isolation region includes a first isolation layer coupled to a channel stop region. The channel stop region may include an impurity-doped region.

13 Claims, 43 Drawing Sheets

(56) References Cited

U.S. PATENT DOCUMENTS

2012/0025199 A1 2/2012 Chen et al.
2013/0285181 A1* 10/2013 Lin .................... H01L 27/1464
257/432

FOREIGN PATENT DOCUMENTS

| KR | 10-2004-0058689 A | 7/2004 |
| KR | 10-2004-0058753 A | 7/2004 |
| KR | 10-2006-0093385 A | 8/2006 |
| KR | 10-0730469 B1 | 6/2007 |
| KR | 10-2008-0014301 A | 2/2008 |

OTHER PUBLICATIONS

R.D. Rung et al., "Deep Trench Isolated CMOS Devices", IEEE, 1982, pp. 237-243.
Ray Fontaine, "A Review of the 1.4 μm Pixel Generation",Technology Analysis Group.

* cited by examiner

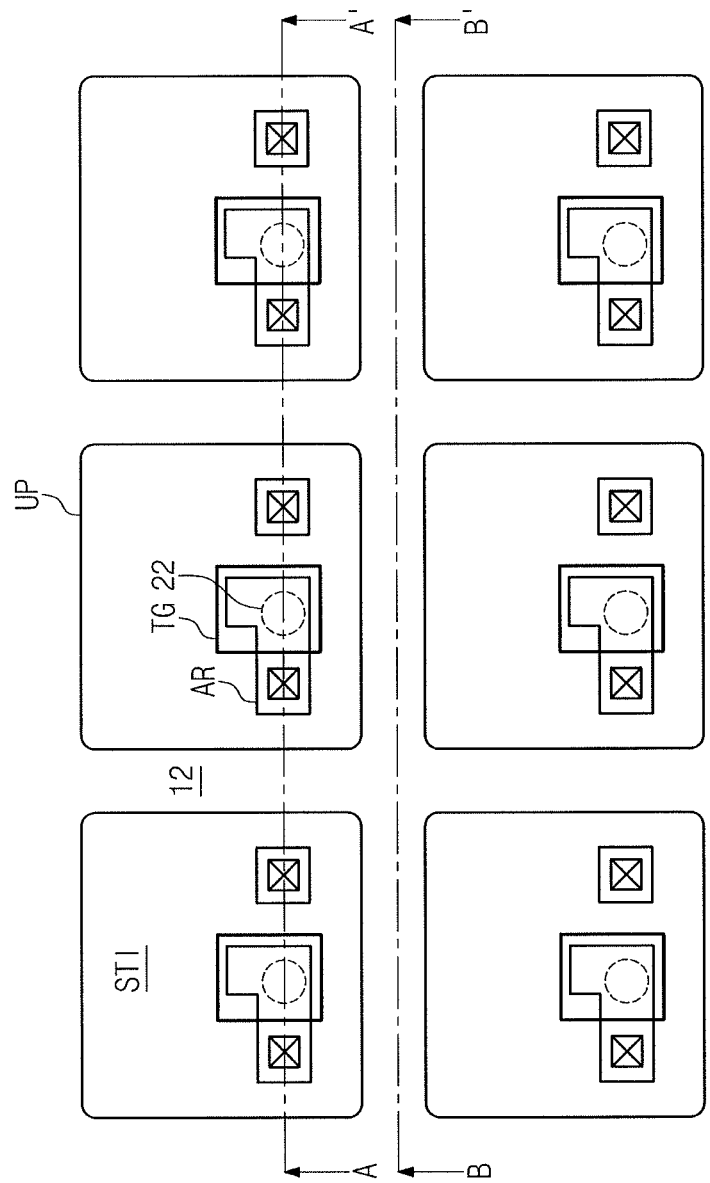

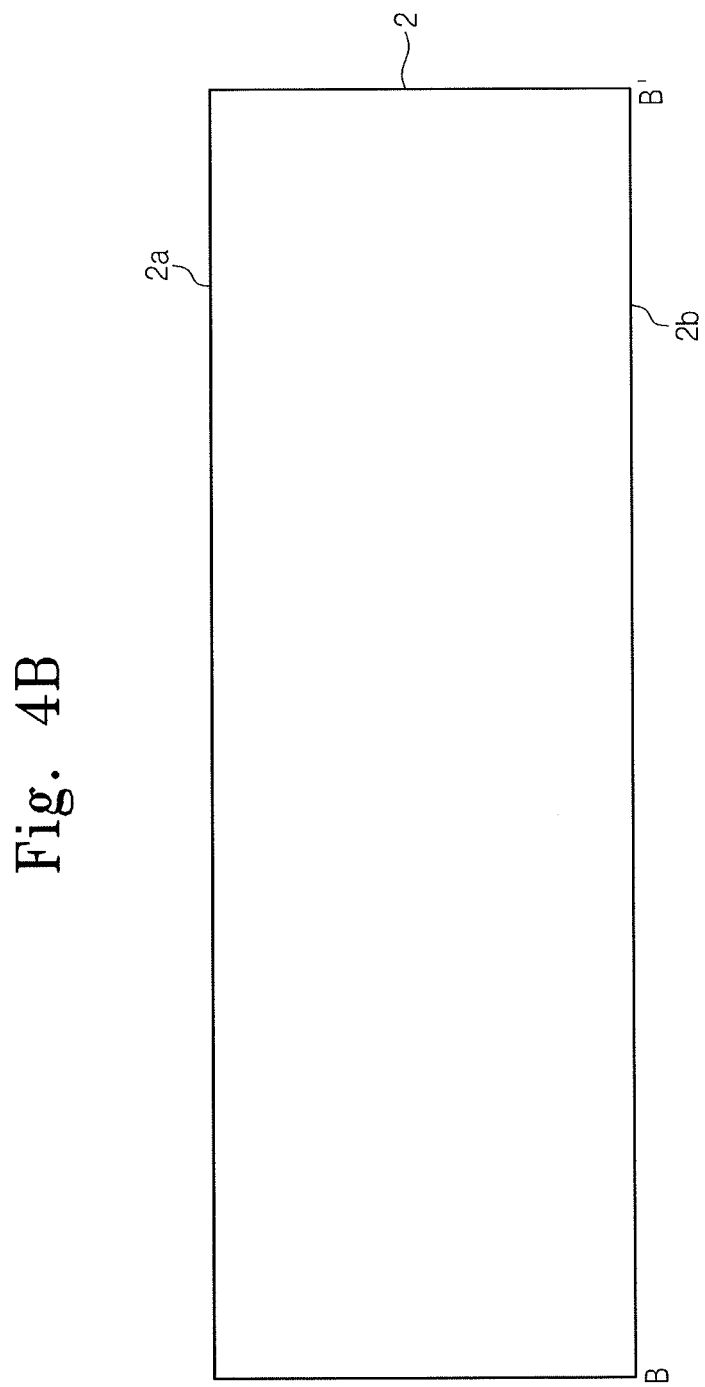

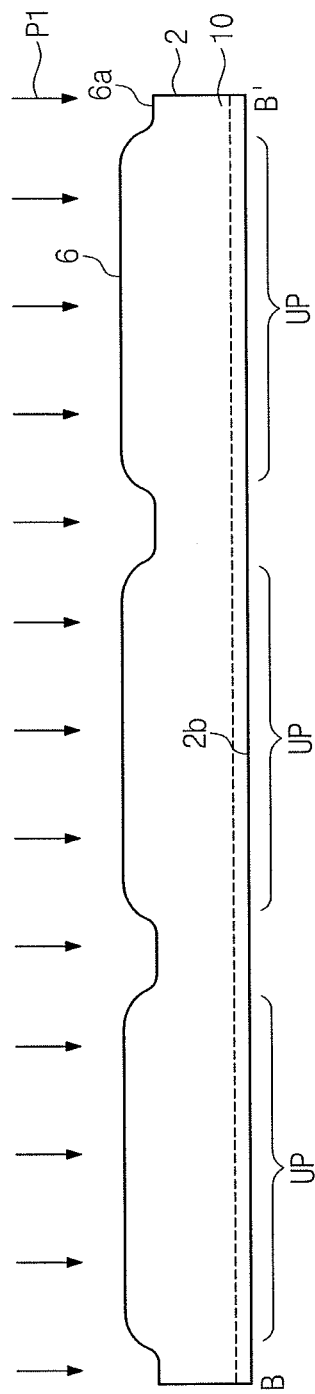

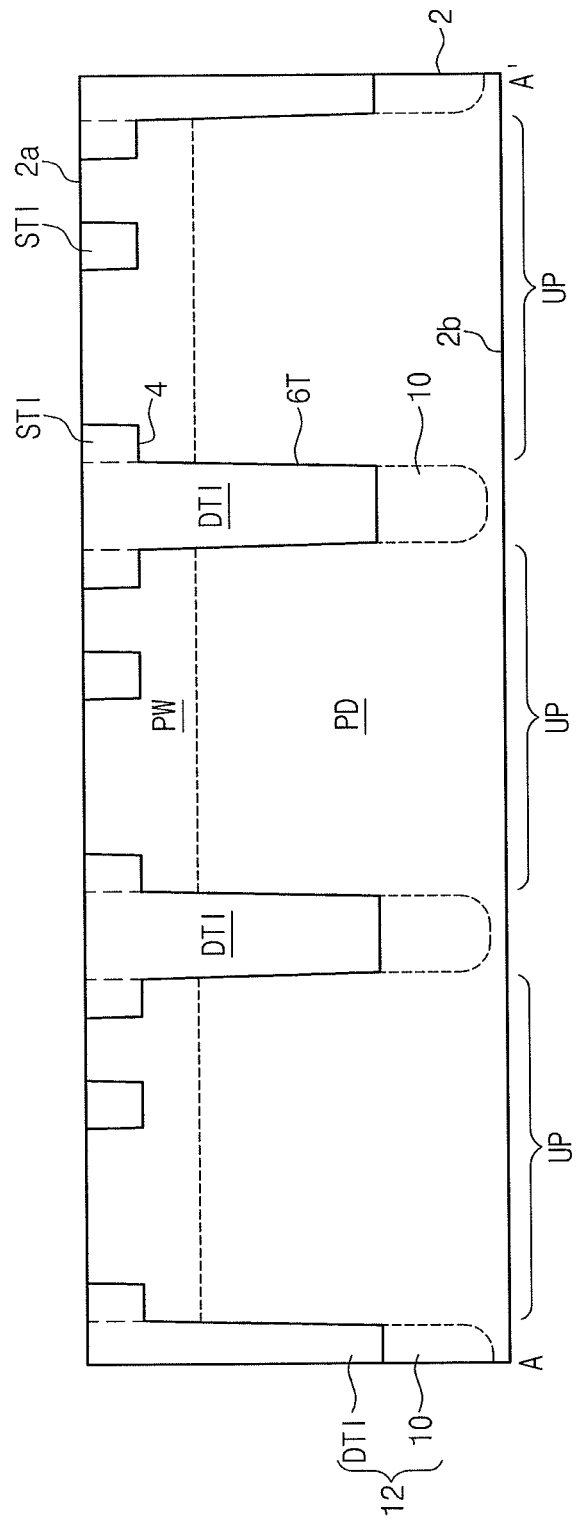

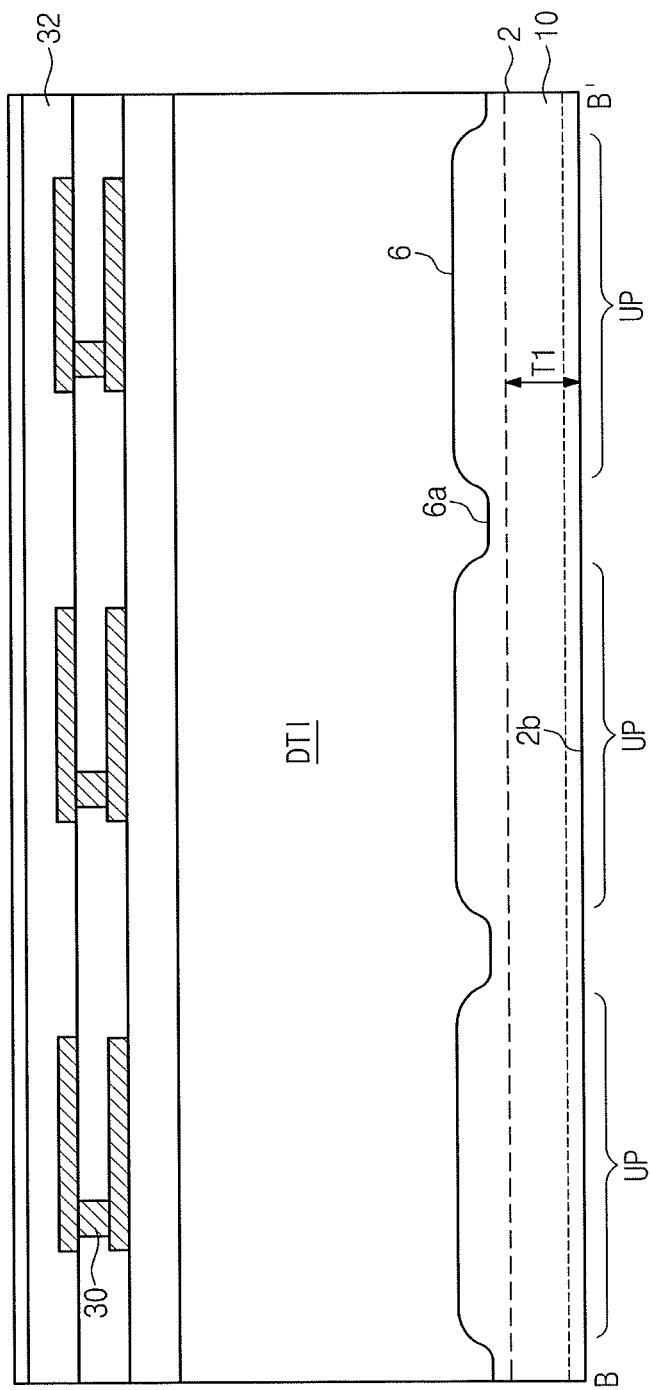

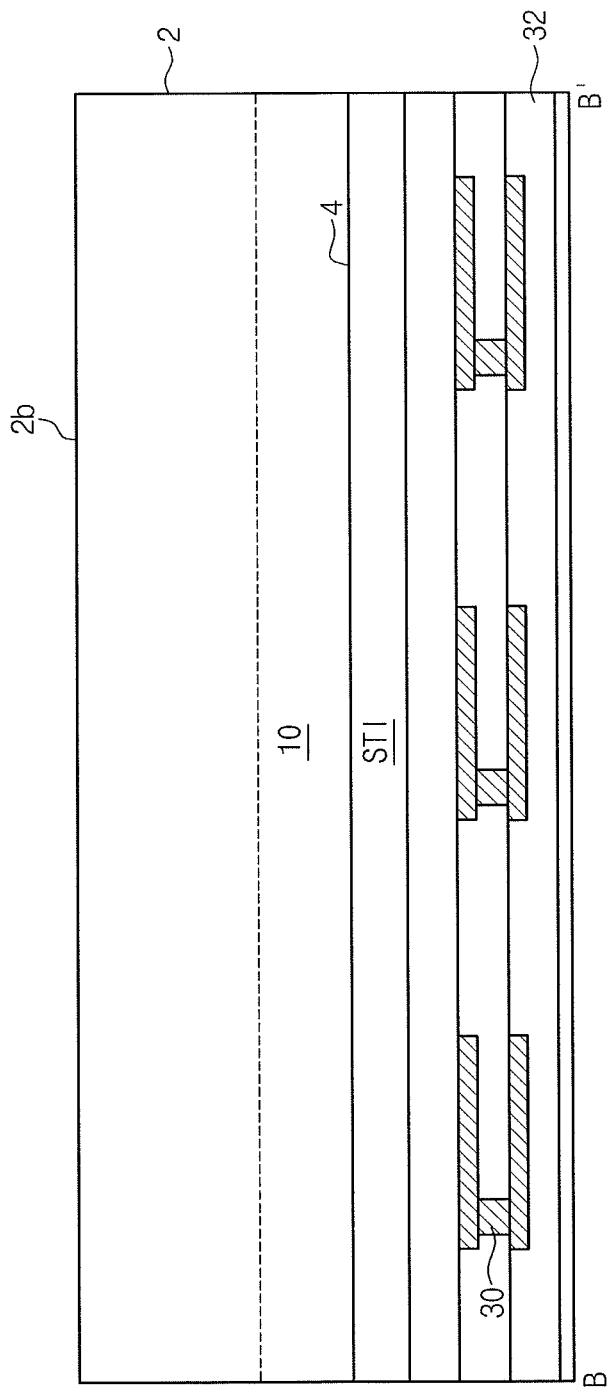

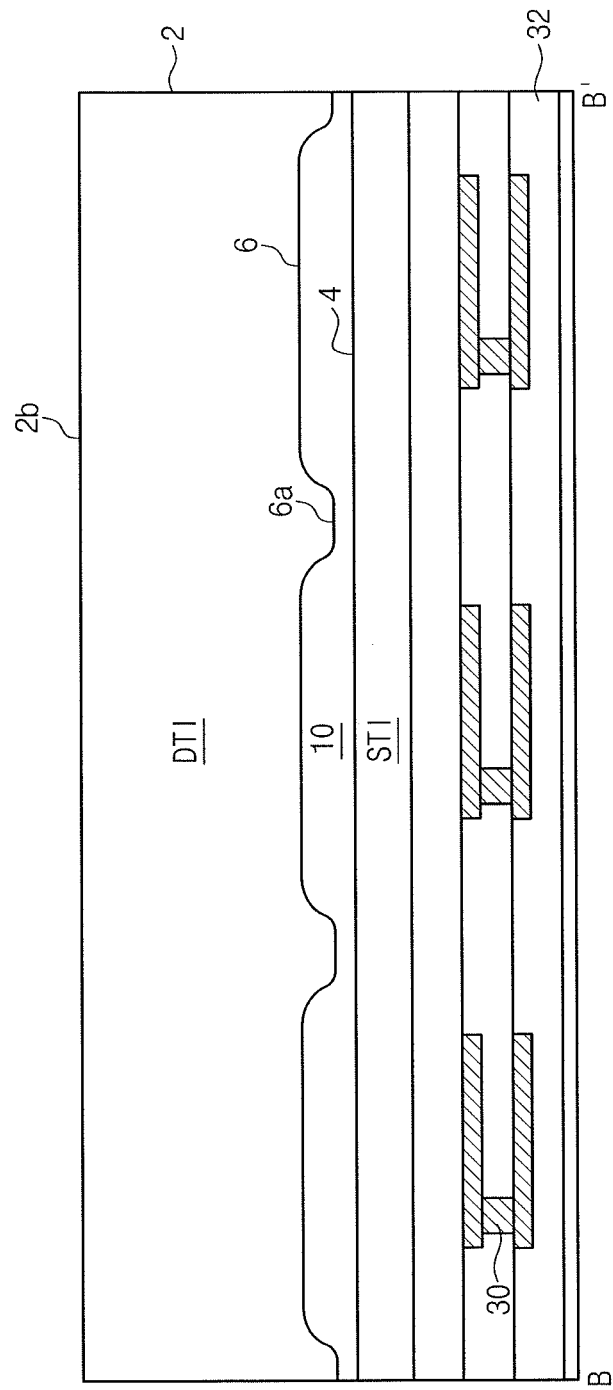

IMAGE SENSOR AND METHOD OF FORMING THE SAME

CROSS-REFERENCE TO RELATED APPLICATION

Korean Patent Application No. 10-2013-0019826, filed on Feb. 25, 2013, and entitled, "Image Sensor and Method of Forming the Same," is incorporated by reference herein in its entirety.

BACKGROUND

1. Field

One or more embodiments described herein relate to an image sensor.

2. Description of the Related Art

An image sensor is a semiconductor device that converts an optical image into an electrical signal. Examples of image sensors include a charge coupled device (CCD)-type image sensor and a complementary metal oxide semiconductor (CMOS)-type image sensor, or CIS for short. A CIS has a plurality of pixels arranged two-dimensionally. Each pixel has a photodiode (PD) that converts incident light into an electrical signal.

The integration of image sensors has increased over the years, which has resulted in a substantial reduction in the size of their pixels. As a result, cross-talk between pixels in these highly integrated devices may worsen, thereby reducing performance.

SUMMARY

In accordance with one embodiment, an image sensor includes a substrate including a first surface opposing a second surface and a plurality of pixel regions, the second surface to receive incident light; a photoelectric converter in each of the pixel regions; a gate electrode on the photoelectric converter; and a pixel isolation region isolating at adjacent pixel regions, wherein the pixel isolation region includes a first isolation layer coupled to a channel stop region and wherein the channel stop region is an impurity-doped region. The first isolation layer may contact the first surface and the channel stop region may contact the second surface.

Also, the image sensor may include a second isolation layer having a depth shallower than a depth of the first isolation layer, wherein the second isolation layer contacts the first surface. The first isolation layer and the second isolation layer may be integrally formed as one body. The first isolation layer may contact the second surface and the channel stop region may be adjacent to the first surface.

Also, the image sensor may include a second isolation layer contacting the first surface and having a depth shallower than a depth of the first isolation layer, wherein: second isolation layer is spaced from the first isolation layer; and the channel stop region is between the first and second isolation layers. An air gap region may be included in the first isolation layer. A bottom surface or a top surface of the first isolation layer may be uneven.

Also, the gate electrode may be on the first surface and the image sensor may include a color filter and a micro-lens on the second surface. The photoelectric converter may include dopants of a first conductivity type, and the channel stop region may include dopants of a second conductivity type.

In accordance with another embodiment, a method forming an image sensor includes forming a pixel isolation region in a substrate to separate adjacent pixel regions, the substrate including a first surface opposing a second surface, the second surface to receive incident light; and forming a photoelectric converter and a gate electrode in each of the pixel regions, wherein the pixel isolation region includes a first isolation layer coupled to a channel stop region and wherein the channel stop region is an impurity-doped region.

Also, forming the pixel isolation region may include etching the substrate adjacent to the first surface to form a first trench; forming the channel stop region in the substrate under the first trench; forming the first isolation layer to fill the first trench; and grinding the substrate adjacent to the second surface to expose the channel stop region.

Also, forming the pixel isolation region may include forming the channel stop region in the substrate adjacent to the first surface; etching the substrate adjacent to the second surface to form a first trench exposing the channel stop region; and forming the first isolation layer to fill the first trench.

Also, the method may include etching the substrate adjacent to the first surface to form a second trench having a depth shallower than a depth of the first trench; forming the channel stop region in the substrate under the second trench; and forming a second isolation layer filling the second trench. The first isolation layer may include an air gap region.

In accordance with another embodiment, an image sensor may include a plurality of pixel regions, each pixel region including a photoelectric converter and an active region, the photoelectric converter being a first material doped with impurities of a first type, the photoelectric converter having a first surface on which light is incident and a second surface adjacent the active region; and a separator between adjacent pixel regions, wherein the separator includes a first surface, co-planar with the first surface of the photoelectric converter, made of the first material doped with impurities of a second type.

A thickness of the first material doped with impurities of the second type may be greater in a region in which only two pixel regions neighbor each other than in a region in which four pixel regions neighbor each other.

The separator may include an isolation layer extending from adjacent the active region to the first material doped with impurities of the second type. The isolation layer may be wider adjacent the active region than adjacent the first material doped with impurities of the second type. The isolation layer may include an air gap.

BRIEF DESCRIPTION OF THE DRAWINGS

Features will become apparent to those of ordinary skill in the art by describing in detail exemplary embodiments with reference to the attached drawings in which:

FIG. 2 illustrates an example of a layout of an image sensor;

FIGS. 4A to 11A illustrate stages in a method of forming an image sensor having a cross-sectional view of FIG. 3A;

FIGS. 4B to 11B stages in a method of a method of forming an image sensor having a cross-sectional view of FIG. 3B;

FIGS. 15A to 19A stages in a method of forming an image sensor having a cross-sectional view of FIG. 14A;

FIGS. 15B to 19B illustrate stages in a method of forming an image sensor having a cross-sectional view of FIG. 14B;

DETAILED DESCRIPTION

Figure 1:
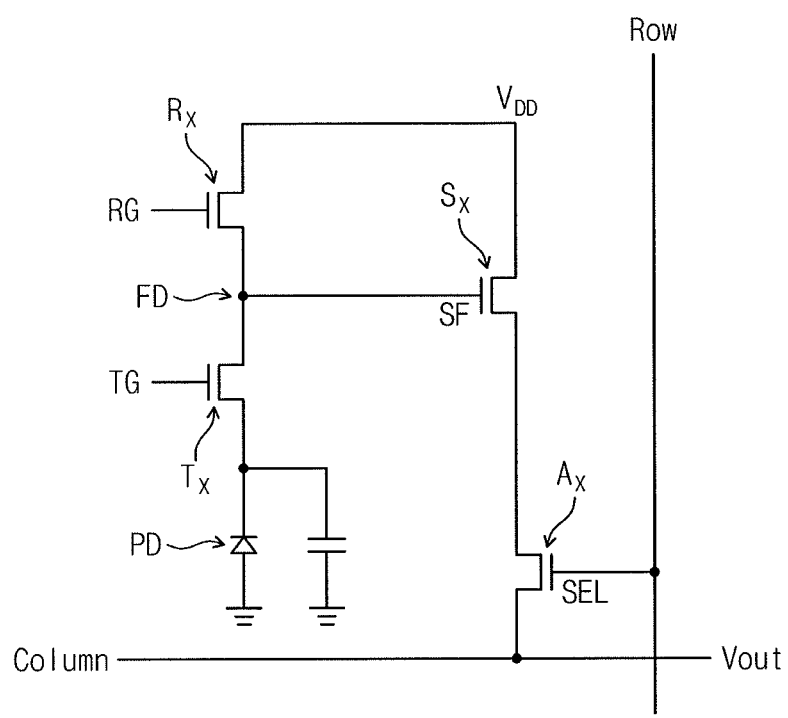
FIG. 1 illustrates an embodiment of an image sensor.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an image sensor. Referring to FIG. 1, each pixel of the image sensor may include a photoelectric converter PD, a transfer transistor TX, a source follower transistor SX, a reset transistor RX, and a selection transistor AX. The transfer transistor TX, the source follower transistor SX, the reset transistor RX, and the selection transistor AX include a transfer gate TG, a source follower gate SF, a reset gate RG, and a selection gate SEL, respectively.

The photoelectric converter PD may be a photodiode including an N-type dopant region and a P-type dopant region. A drain of the transfer transistor TX may correspond to a floating diffusion region FD. The floating diffusion region FD may also be a source of the reset transistor RX. The floating diffusion region FD may be electrically connected to the source follower gate SF of the source follower transistor SX. The source follower transistor SX is connected to the selection transistor AX. The reset transistor RX, the source follower transistor SX, and the selection transistor AX may be shared by adjacent pixels. Thus, the integration density of the image sensor may be improved.

A method of operating the image sensor will be described with reference to FIG. 1. In a state that light is blocked, a power voltage VDD is applied to a drain of the reset transistor RX and a drain of the source follower transistor SX and the reset transistor RX is turned-on to discharge charge remaining in the floating diffusion region FD. Thereafter, the rest transistor RX is turned-off.

If light is incident on the photoelectric converter PD, electron-hole pairs (EHPs) are generated in the photoelectric converter PD. Holes may be moved into and then accumulated in the P-type dopant region, and electrons may be moved into and then accumulated in the N-type dopant region. If the transfer transistor TX is turned-on, charges such as the electrons may be transferred into and then accumulated in the floating diffusion region FD. A gate bias of the source follower transistor SX may be changed in proportion to the amount of the accumulated charges in the floating diffusion region FD, so that a source potential of the source follower transistor SX may be changed. At this time, if the selection transistor AX is turned-on, a signal caused by the charges may be outputted through a column line.

Figure 3A:
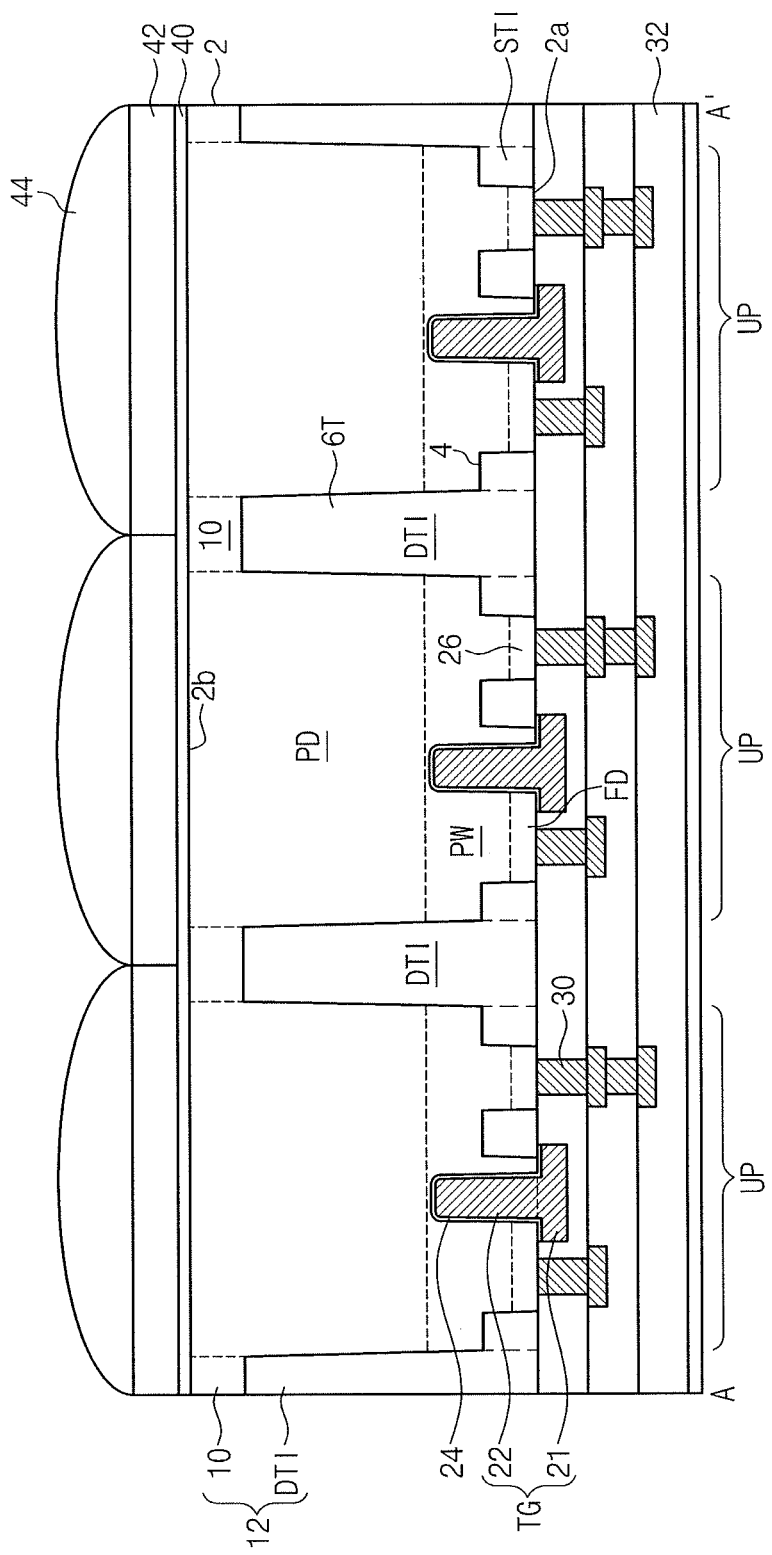
FIGS. 3A and 3B illustrate views along section lines A-A and B-B of FIG. 2.
Figure 3B:
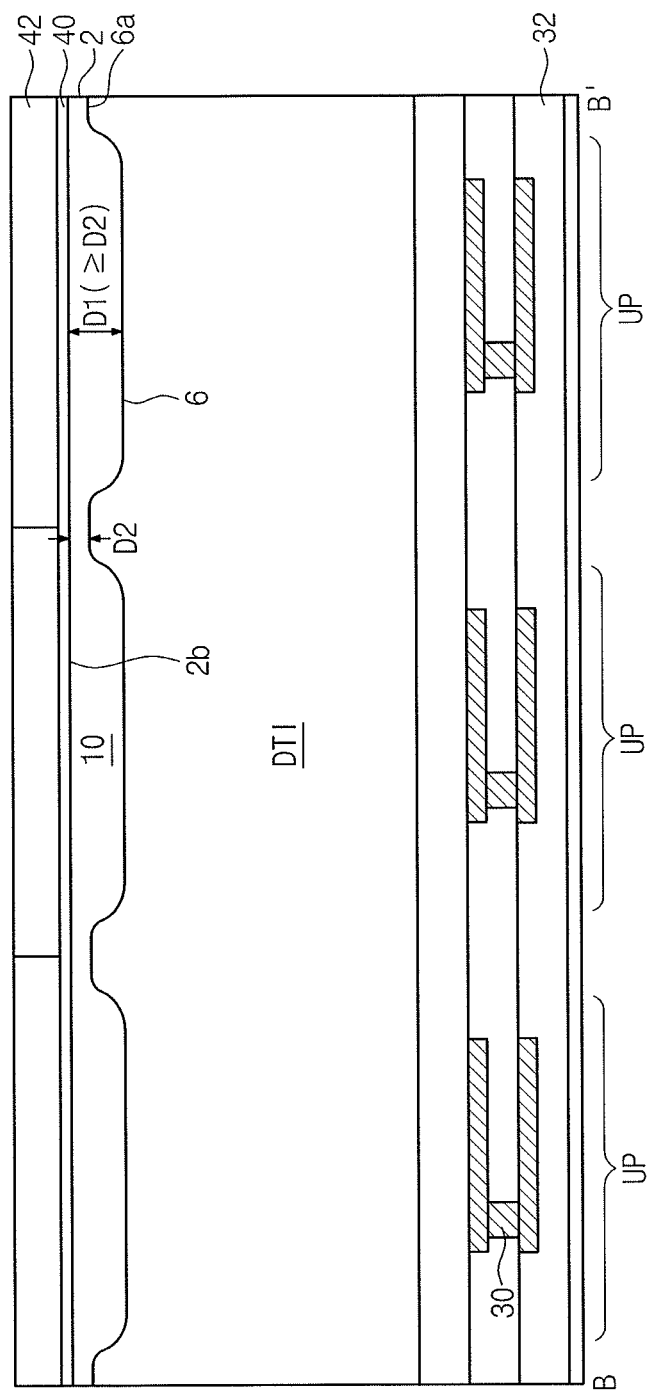

FIG. 2 illustrates an example of a layout of an image sensor, and FIGS. 3A and 3B are cross-sectional views respectively taken along lines A-A and B-B of FIG. 2. Referring to FIGS. 1, 2, 3A, and 3B, a substrate 2 including unit pixel regions UP is provided. The substrate 2 may be a silicon wafer, a silicon-on-insulator (SOI) substrate, or a semiconductor epitaxial layer. The substrate 2 includes a first surface 2a and a second surface 2b opposite to each other, i.e., spaced apart along a z-direction. Light may be incident on the second surface 2b.

A pixel isolation region 12 may be disposed in the substrate 2 to separate the unit pixel regions UP from each other. The pixel isolation region 12 may have a mesh-shape in a plan view. The pixel isolation region 12 may have a height corresponding to a thickness of the substrate 2. The pixel isolation region 12 may connect the first surface 2a and the second surface 2b.

In one embodiment, the pixel isolation region 12 includes a deep device isolation layer DTI and a channel stop region 10 which are in contact with each other. The deep device isolation layer DTI may be formed of an insulating material having a refractive index different from that of the substrate 2. For example, the deep device isolation layer DTI may be formed of at least one of a silicon oxide layer, a silicon nitride layer, and a silicon oxynitride layer.

In this embodiment, the deep device isolation layer DTI may be in contact with the first surface 2a and may be spaced apart from the second surface 2b. As illustrated in FIG. 3B, a top surface of the deep device isolation layer DTI, which is adjacent to the second surface 2b, may be winding or may have an uneven structure. A first distance D1 from the second surface 2b to a top surface 6 of the deep device isolation layer DTI, between two neighboring unit pixel regions UP, may be substantially equal to or greater than a second distance D2 from the second surface 2b to a top surface 6a of the deep device isolation layer DTI in a region adjacent to all of four neighboring unit pixel regions UP.

The channel stop region 10 may be in contact with the second surface 2b. The channel stop region 10 may be an impurity-doped region. For example, a photoelectric converter PD may be doped with N-type dopants and the channel stop region 10 may be doped with P-type dopants. Since the pixel isolation region 12 is disposed to extend from the first surface 2a to the second surface 2b in the substrate 2, the unit pixel regions UP are completely separated from each other. Thus, cross-talk of obliquely incident light may be prevented.

Additionally, the photoelectric converter PD may be in contact with a sidewall of the pixel isolation region 12. Thus, an area of the photoelectric converter PD may be substantially equal to an area of the each of the unit pixel regions UP. As a result, a light receiving area of the photoelectric converter PD may be increased to improve a fill factor.

A plurality of transistors TX, AX, RX, and SX and interconnections are disposed on the first surface 2a. A well region PW is disposed on the photoelectric converter PD. For example, the well region PW may be doped with P-type dopants. A shallow device isolation layer STI may be disposed on the well region PW to define active regions AR of the transistors TX, AX, RX, and SX. The shallow device isolation layer STI may have a shallower depth than the deep device isolation layer DTI. In a part region, the shallow device isolation layer STI and the deep device isolation layer may be connected to each other to constitute one body. As illustrated in FIG. 3A, the shallow device isolation layer STI and the deep device isolation layer DTI may constitute an inverted T-shape between the unit pixel regions UP.

In each of the unit pixel regions UP, a transfer gate TG corresponding to a gate electrode of a transfer transistor TX may be disposed on the first surface 2a of the substrate 2. A gate insulating layer 24 may be disposed between the transfer gate TG and the substrate 2. A top surface of the transfer gate TG may be higher than the first surface 1a of the substrate 2. A bottom surface of the transfer gate TG may be disposed in the well region PW formed in the substrate 2. In other words, the transfer gate TG may include a protrusion 21 protruding from the substrate 2 and a buried portion 22 extending into the substrate 2.

A floating diffusion region FD may be disposed in the substrate 2 between an upper sidewall of the buried portion 22 and the shallow device isolation layer STI. The floating diffusion region FD may be doped with dopants of a conductivity type opposite to the conductivity type of the dopants in the well region PW. For example, the floating diffusion region FD may be doped with N-type dopants.

A ground impurity-doped region 26 may be disposed in an active region AR, which is spaced apart from the transfer gate TG by the shallow device isolation layer STI. The ground impurity-doped region 26 may be doped with dopants of the same conductivity type as the dopants in the well region PW. For example, the ground impurity-doped region 26 may be doped with P-type dopants. At this time, a dopant concentration of the ground impurity-doped region 26 may be higher than a dopant concentration of the well region PW. The floating diffusion region FD and the ground impurity-doped region 26 may be electrically connected to contact-interconnections 30 disposed on the first surface 2a. The first surface 2a may be covered by a plurality of interlayer insulating layers 32.

An entire surface of the second surface 2b may optionally be covered by anti-reflection layer 40. A color filter 42 and a micro-lens 44 may be disposed on the anti-reflection layer 40 in each of unit pixel regions UP. The color filters 42 may be included in a color filter array. The color filters 42 may be arranged in matrix form in the array. In some embodiments, the color filter array may include a Bayer-pattern including a red filter, a green filter, and a blue filter. In other embodiments, the color filter array may include a yellow filter, a magenta filter, and a cyan filter. Additionally, the color filter array may further include a white filter.

FIGS. 4A to 11A illustrate stages in a method of forming an image sensor having a cross-sectional view of FIG. 3A. FIGS. 4B to 11B illustrate stages in a method of forming an image sensor having a cross-sectional view of FIG. 3B.

Figure 4A:
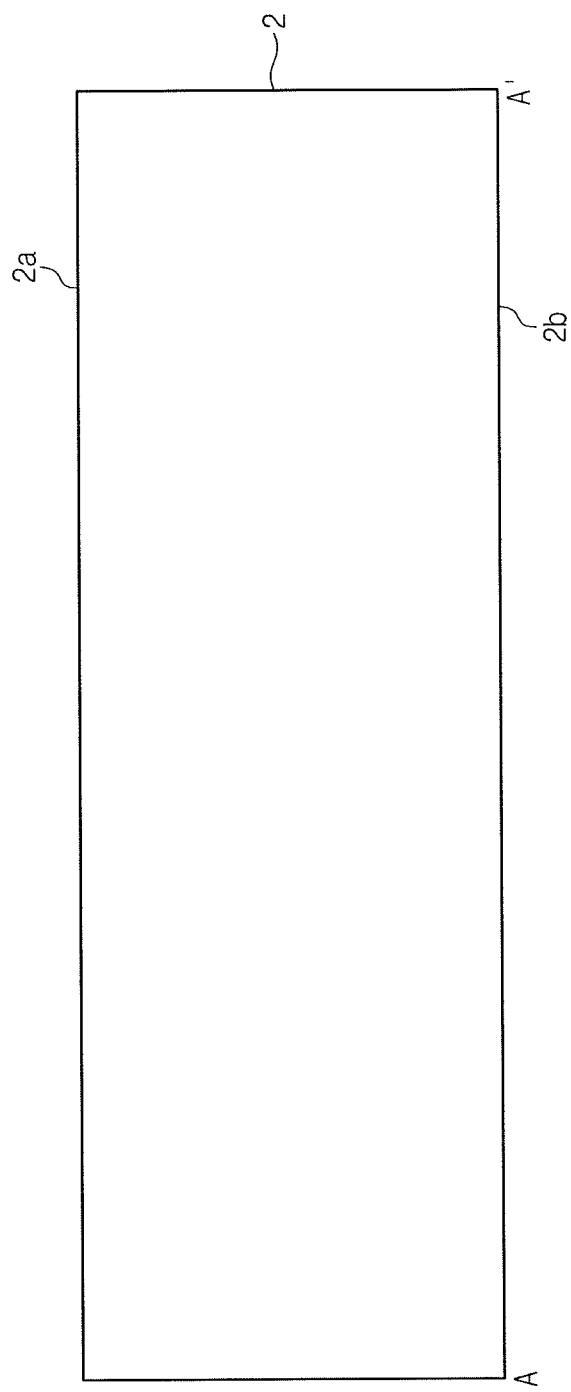

Referring to FIGS. 4A and 4B, initially, a substrate 2 having first and second surfaces 2a and 2b opposite to each other is prepared. The substrate 2 may be a silicon wafer, a semiconductor epitaxial layer formed on the silicon wafer, or a SOI substrate. The substrate 2 may be doped with, for example, P-type dopants.

Figure 5A:
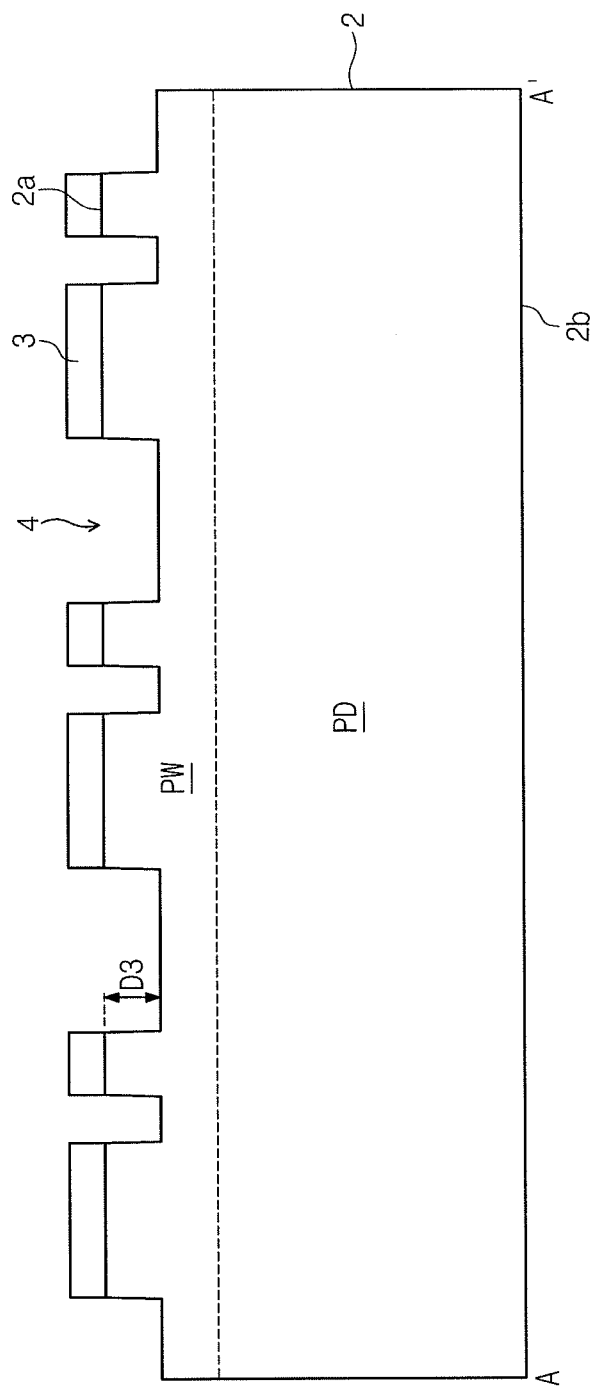
Figure 5B:
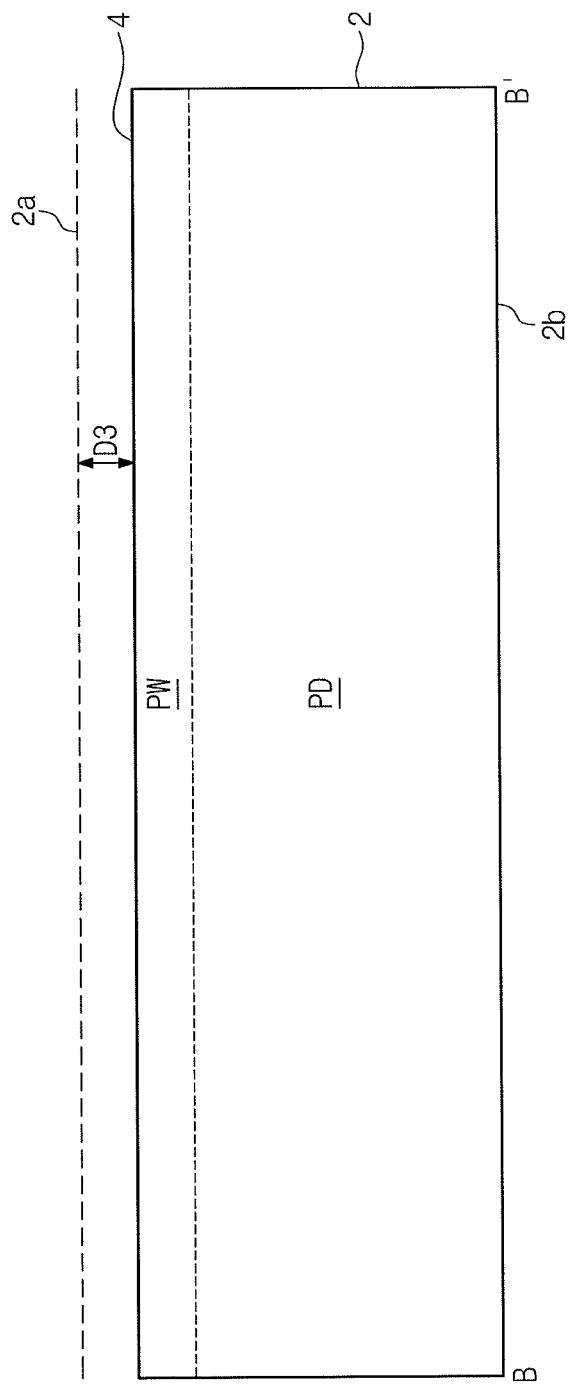

Referring to FIGS. 5A and 5B, ion implantation processes may be performed on the substrate 2 to form the photoelectric converter PD and well region PW. The photoelectric converter PD may be doped with, for example, N-type dopants. The well region PW may be doped with, for example, P-type dopants. In other embodiments, the photoelectric converter PD and/or the well region PW may be formed after formation of a subsequent pixel isolation region 12. A first mask pattern 3 may be formed on the first surface 2a. The substrate 2 adjacent to the first surface 2a may be etched using the first mask pattern 3 as an etch mask, thereby forming a first trench 4 having a first depth D3.

Figure 6A:
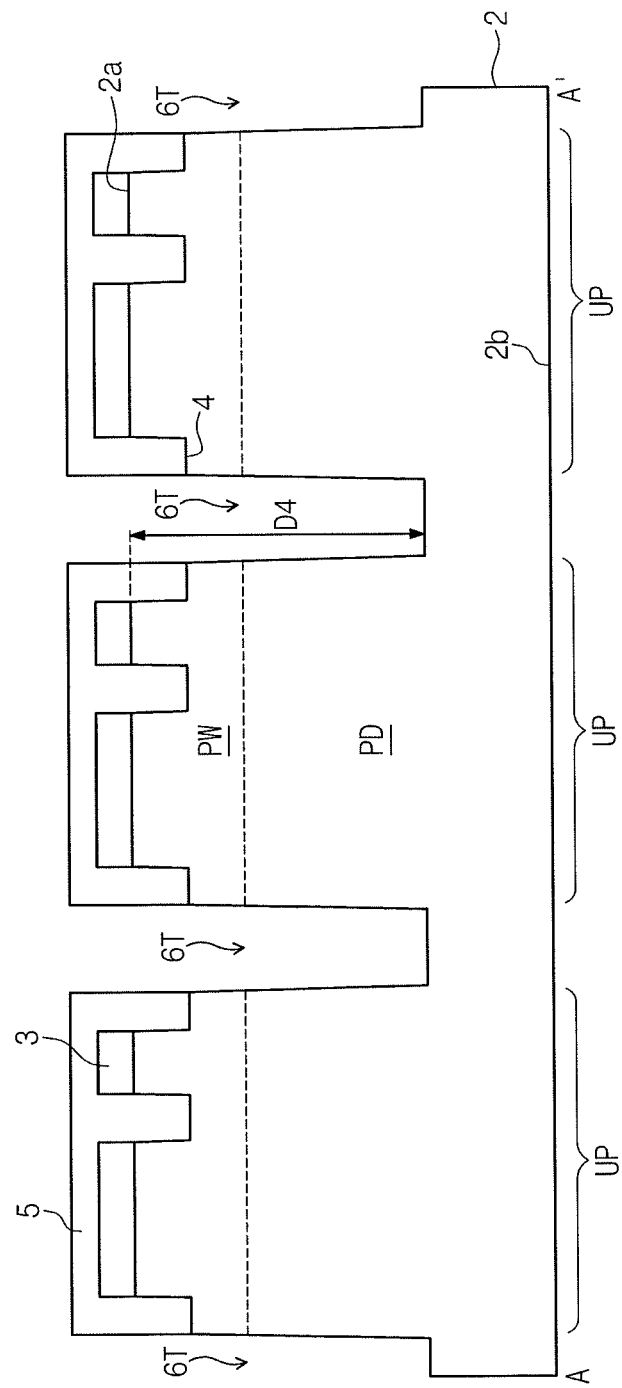
Figure 6B:
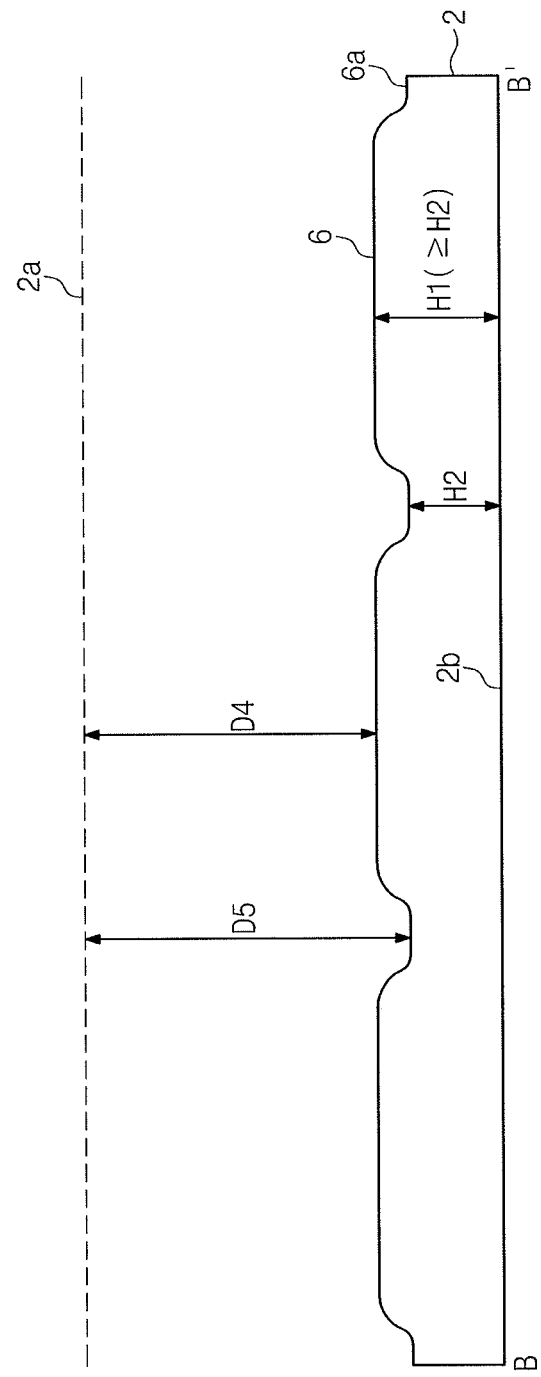

Referring to FIGS. 6A and 6B, a second mask pattern 5 may be formed to define unit pixel regions UP. The second mask pattern 5 may cover the first mask pattern 3. The substrate 2 may be etched using the second mask pattern 5 as an etch mask, thereby forming a second trench 6T having a second depth D4. In a plan view, the second trench 6T may be formed to have a mesh-shape consisting of grooves crossing each other. In other embodiments, the second trench 6T may have a shape different from a mesh.

At this time, the etched amount of the substrate 2 between four unit cell regions UP adjacent to each other may be greater than the etched amount of the substrate 2 between two unit cell regions UP adjacent to each other. In other words, the etched amount of the substrate 2 in a crossing place 6a of the grooves may be greater. Thus, the second trench 6T may have a third depth D5 equal to or greater than the second depth D4 in the place 6a. As a result, a bottom surface of the second trench 6T may be winding or may have an uneven structure. In other words, a first height H1 from the second surface 2b to a bottom surface 6 of the second trench 6T between the two adjacent unit pixel regions UP may be equal to or greater than a second height H2 from the second surface 2a to a bottom surface 6a of the second trench 6T between the four adjacent unit pixel regions UP.

Figure 7A:
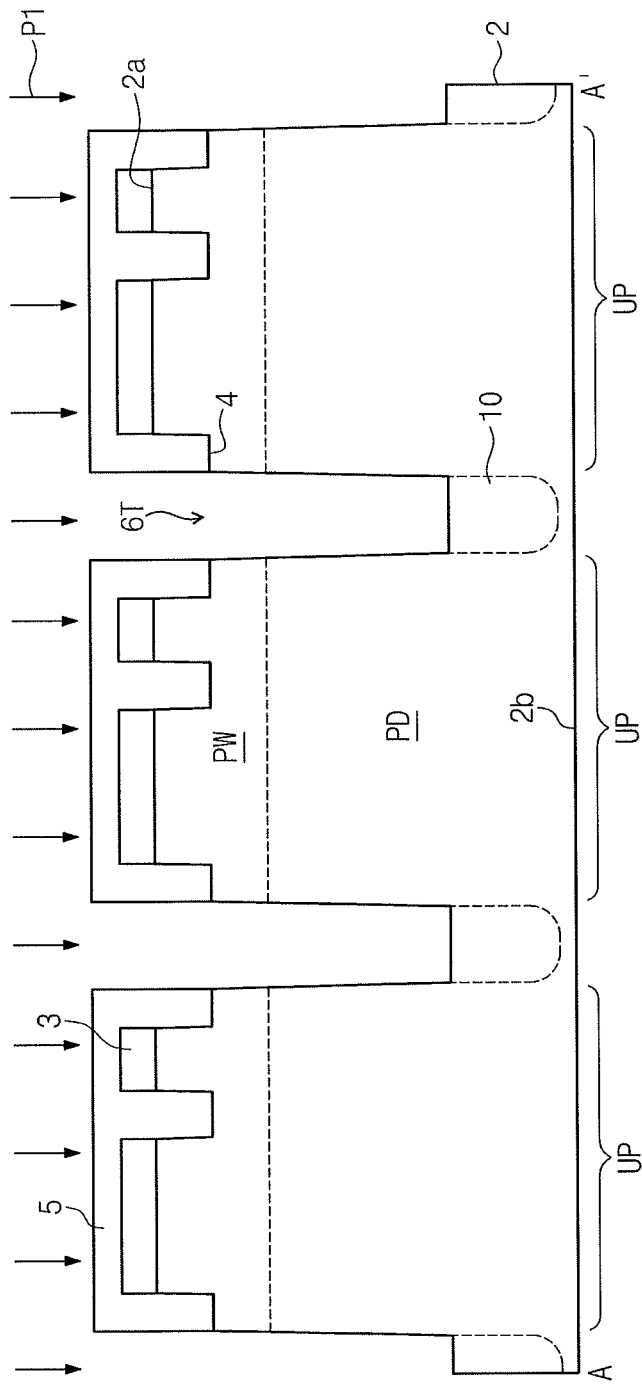

Referring to FIGS. 7A and 7B, an ion implantation process P1 may be performed using the second mask pattern 5 on the substrate 2 having the second trench 6T, thereby forming a channel stop region 100 under the bottom surface of the second trench 6T. The channel stop region 10 may be doped with, for example, P-type dopants.

Figure 8A:
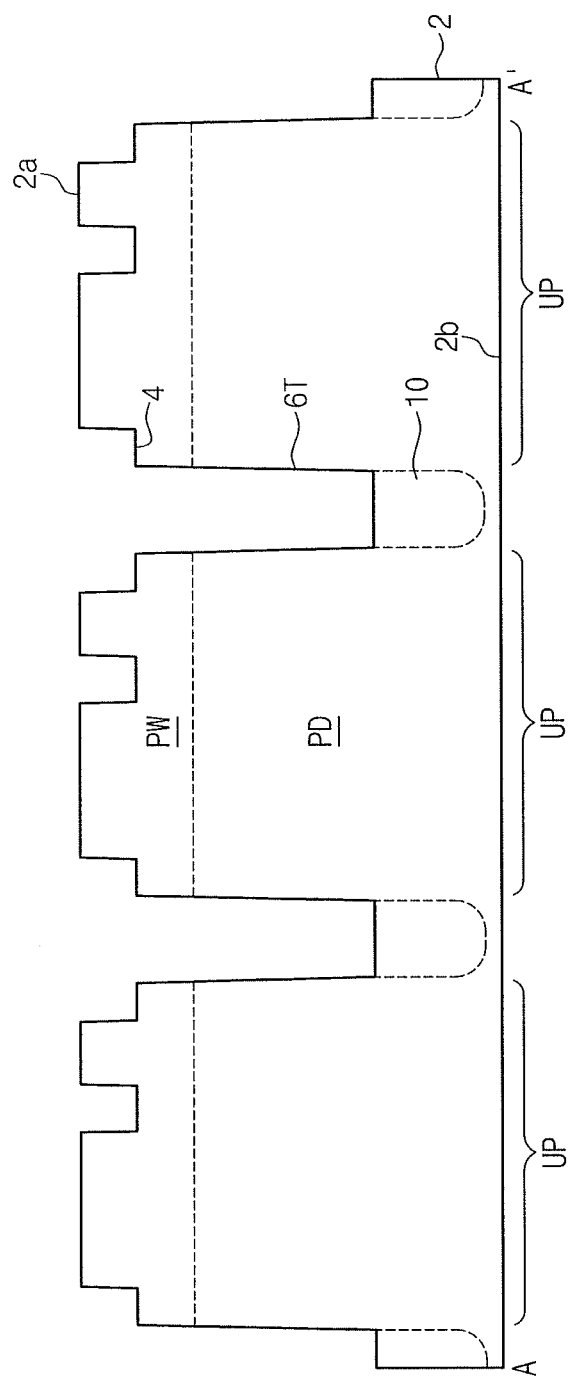
Figure 8B:
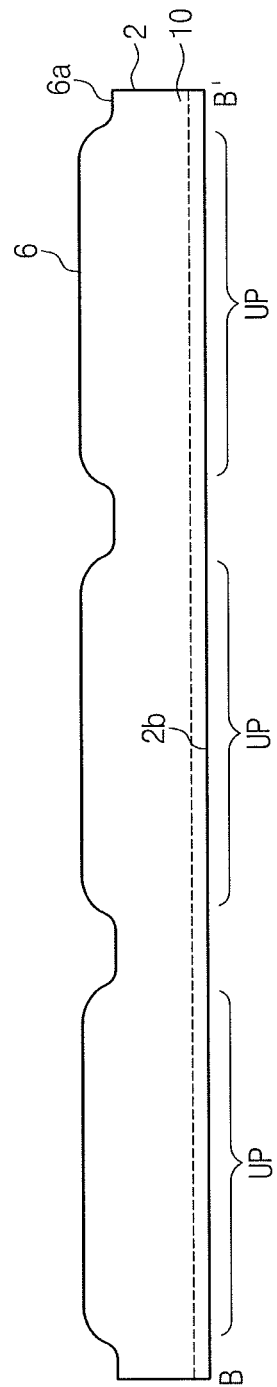

Referring to FIGS. 8A and 8B, the second mask pattern 5 and the first mask pattern 3 may be selectively removed. Thus, the first and second trenches 4 and 6T are exposed.

Figure 9B:
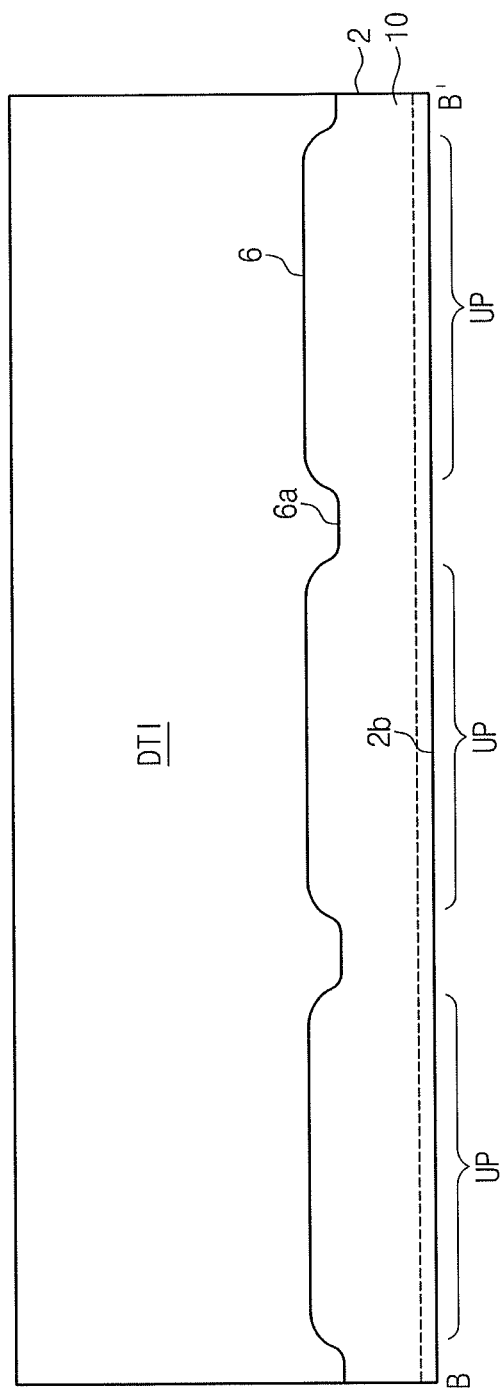

Referring to FIGS. 9A and 9B, an insulating layer may be formed on the first surface 2a of the substrate 2 to fill the first and second trenches 4 and 6T. Subsequently, a planarization etching process may be performed on the insulating layer, thereby forming a shallow device isolation layer STI and a deep device isolation layer DTI in the first trench 4 and the second trench 6T, respectively. At this time, the first surface 2a may be exposed. Thus, a pixel isolation region 12 including the deep device isolation layer DTI and the channel stop region 10 may be formed to separate unit pixel regions UP from each other.

Figure 10A:
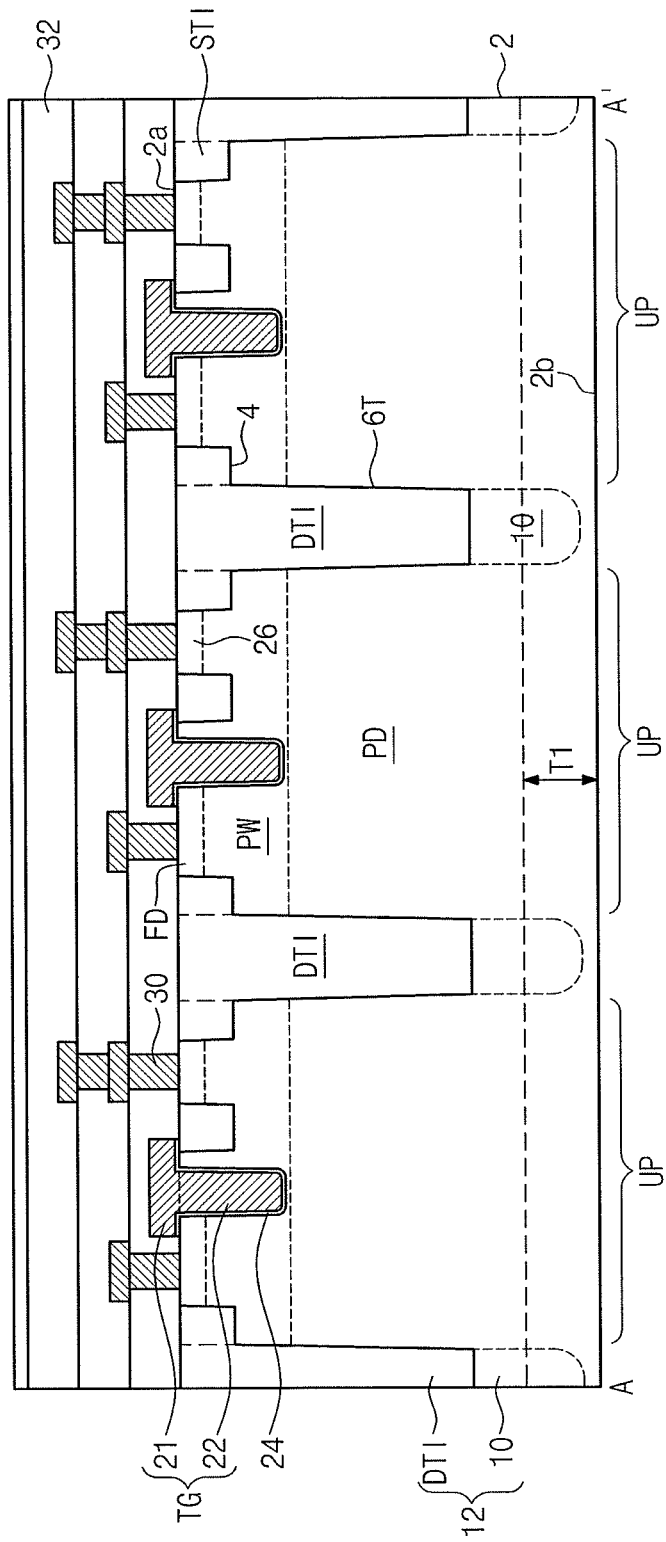
Figure 11A:
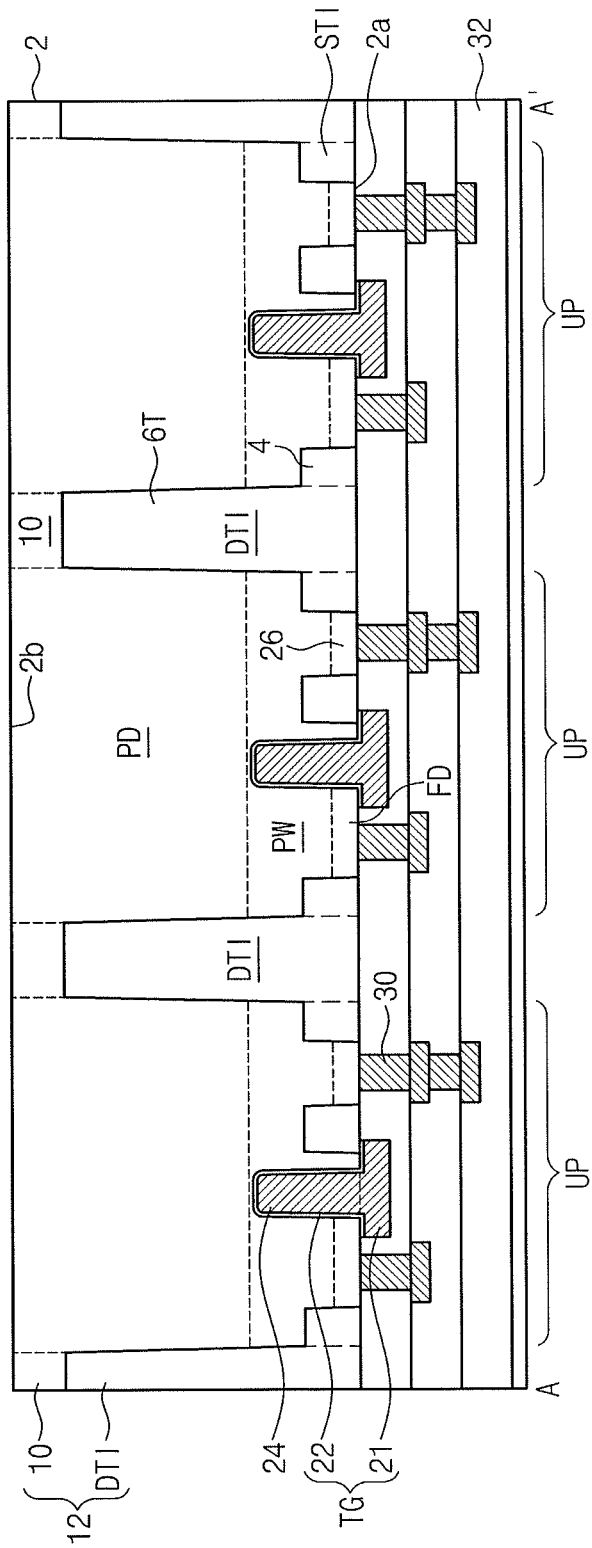
Figure 11B:
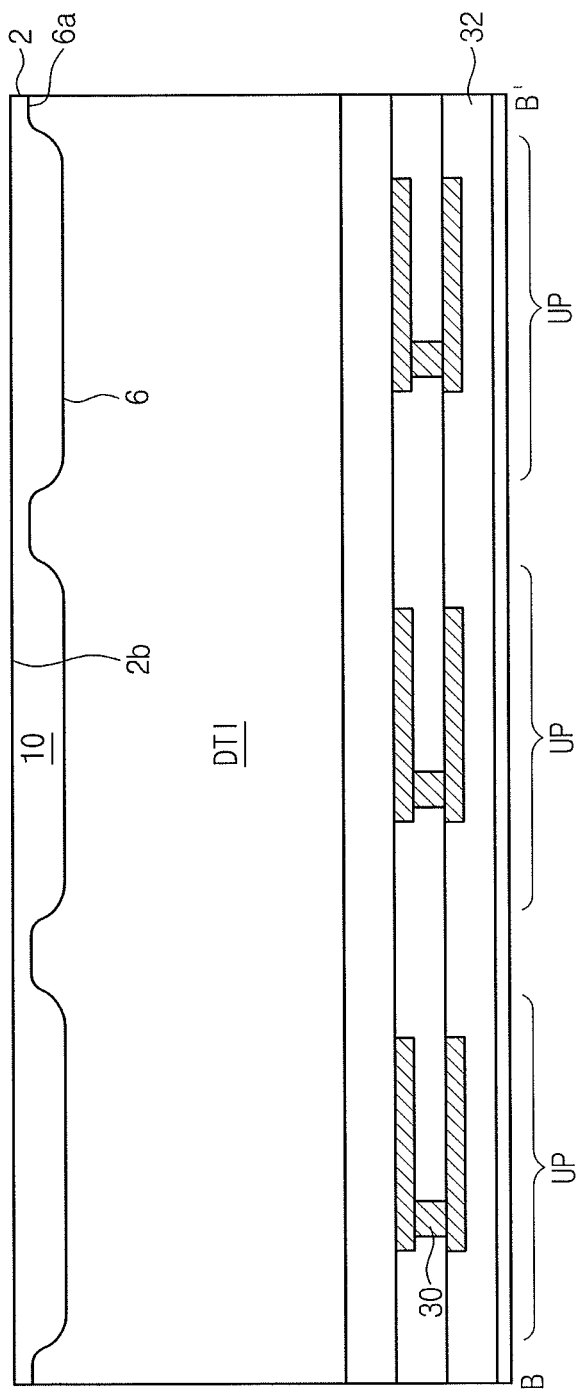

Referring to FIGS. 10A and 10B, a gate insulating layer 24 and a transfer gate TG may be formed on the first surface 2a. Then, a floating diffusion region FD and a ground impurity-doped region 26 may be formed. Contact-interconnections 30 and interlayer insulating layers 32 may be formed on the first surface 2a.

Referring to FIGS. 10A, 10B, 11A, and 11B, the substrate 2 may be flipped such that the second surface 2b faces up.

A grinding process or a chemical mechanical polishing (CMP) process may be performed to remove a portion having a first thickness T1 of the substrate 2 which is adjacent to the second surface 2b. Thus, the channel stop region 10 is exposed. If the pixel isolation region 12 is formed of only the deep device isolation layer DTI, a dispersion of a depth of the second trench 6T may be increased when the second trench 6T is formed. Thus, a dispersion of a depth of the bottom surface of the deep device isolation layer DTI may be increased, to deteriorate a surface flatness or a surface uniformity of the second surface 2b finally formed by the grinding or CMP process.

Additionally, a stress may be applied to an interface between the substrate 2 and the deep device isolation layer DTI during the grinding or CMP process. As a result, the appearance of defects may increase at the interface between the substrate 2 and the deep device isolation layer DTI. A color difference between pixels and/or a dark current characteristic may be deteriorated by the surface flatness deterioration and/or the defect increase. However, according to one embodiment, the deep device isolation layer DTI is not exposed. Instead, the channel stop region 10 is exposed by the grinding or CMP process. Thus, the surface flatness may be improved and the defects may be reduced when the grinding or CMP process is performed. As a result, the dark current characteristic may be improved to realize a high-definition image sensor.

Subsequently, the anti-reflection layer 40, the color filter 42, and the micro-lens 44 are formed on the second surface 2b, as illustrated in FIGS. 3A and 3B.

Figure 12A:
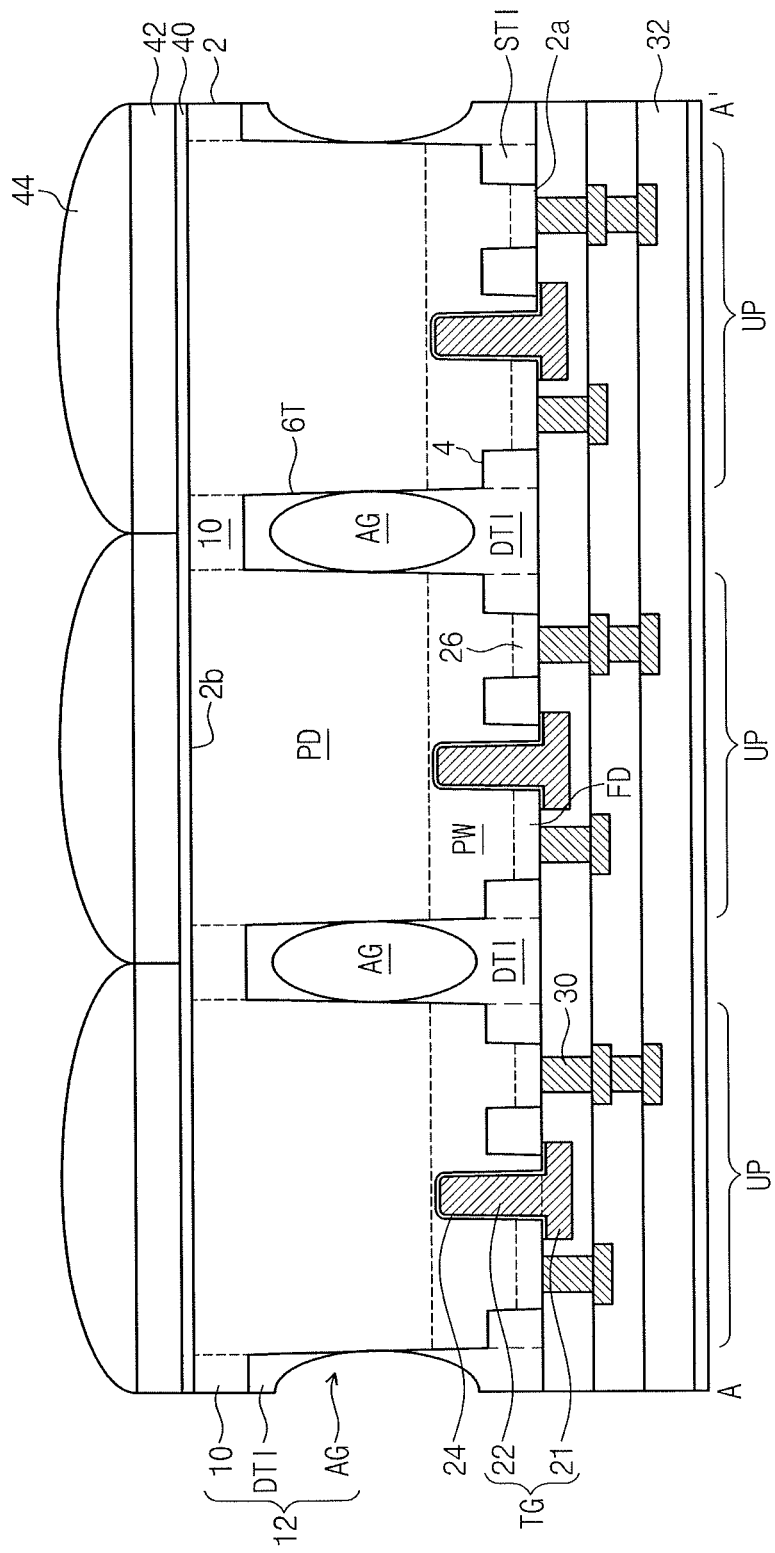
FIGS. 12A and 12B illustrate views along section lines A-A and B-B of FIG. 2.
Figure 12B:
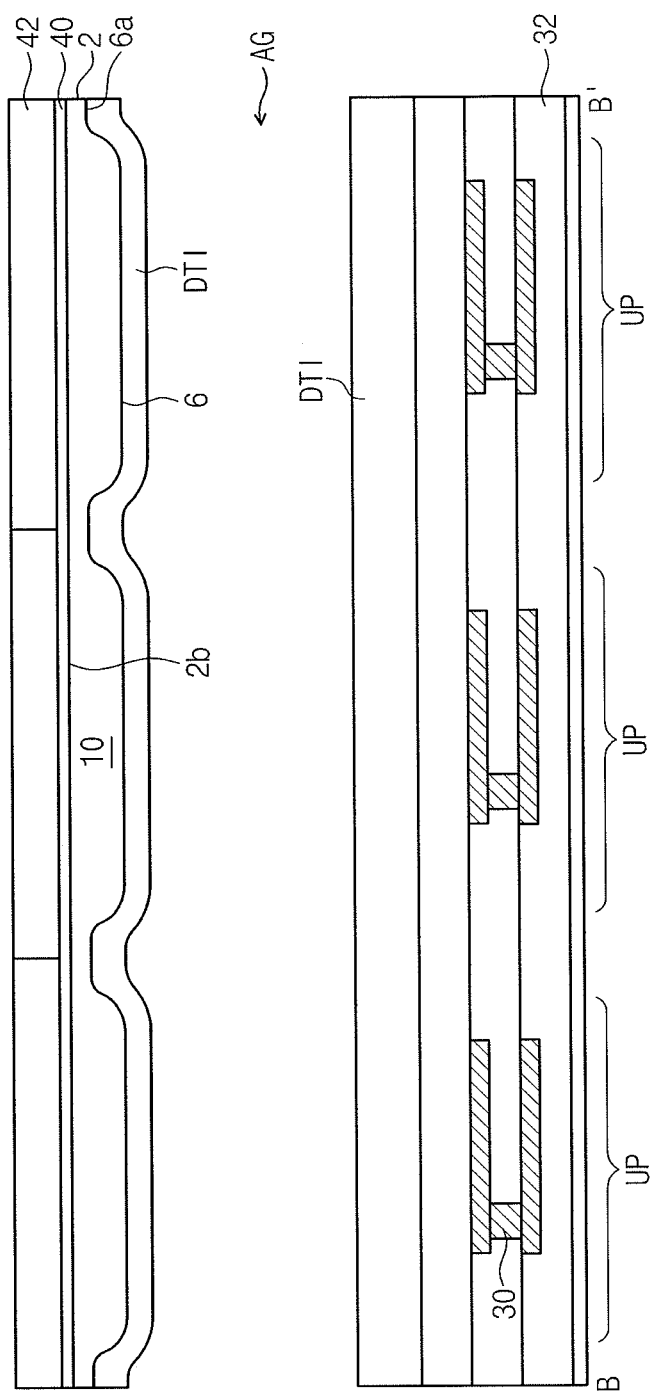

FIGS. 12A and 12B illustrate cross-sectional views respectively taken along lines A-A and B-B of FIG. 2 according to another embodiment. Referring to FIGS. 12A and 12B, an air gap region AG may be formed in a deep device isolation layer DTI in an image sensor according to this embodiment. In other words, a pixel isolation region 12 may include a channel stop region 10, the deep device isolation layer DTI, and the air gap region AG. The air gap region AG has a refractive index different from that of the substrate 2. Air in the air gap region AG has a low dielectric constant of about 1, in order to allow unit pixel regions UP may be more effectively separated from each other. Other elements of the image sensor in the present embodiment may be the same as/similar to corresponding elements of the image sensor in the aforementioned embodiment.

Figure 13A:
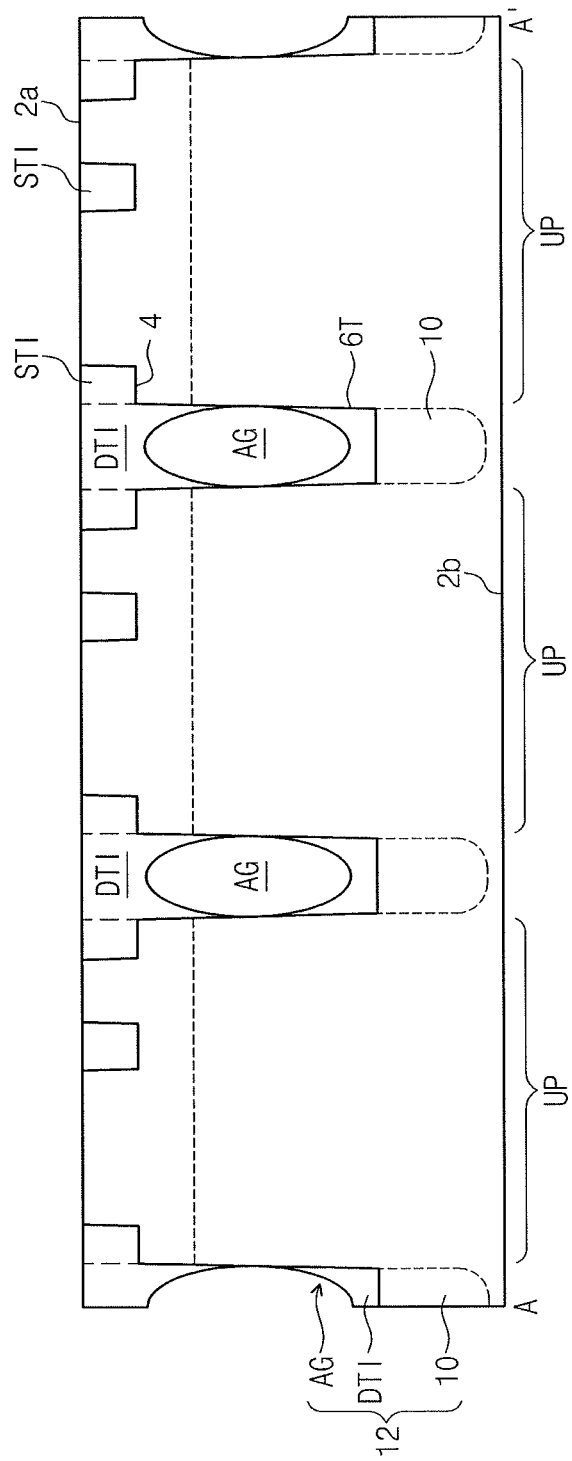
FIG. 13A illustrates a stage in a method of forming an image sensor having a cross-sectional view of FIG. 12A.
Figure 13B:
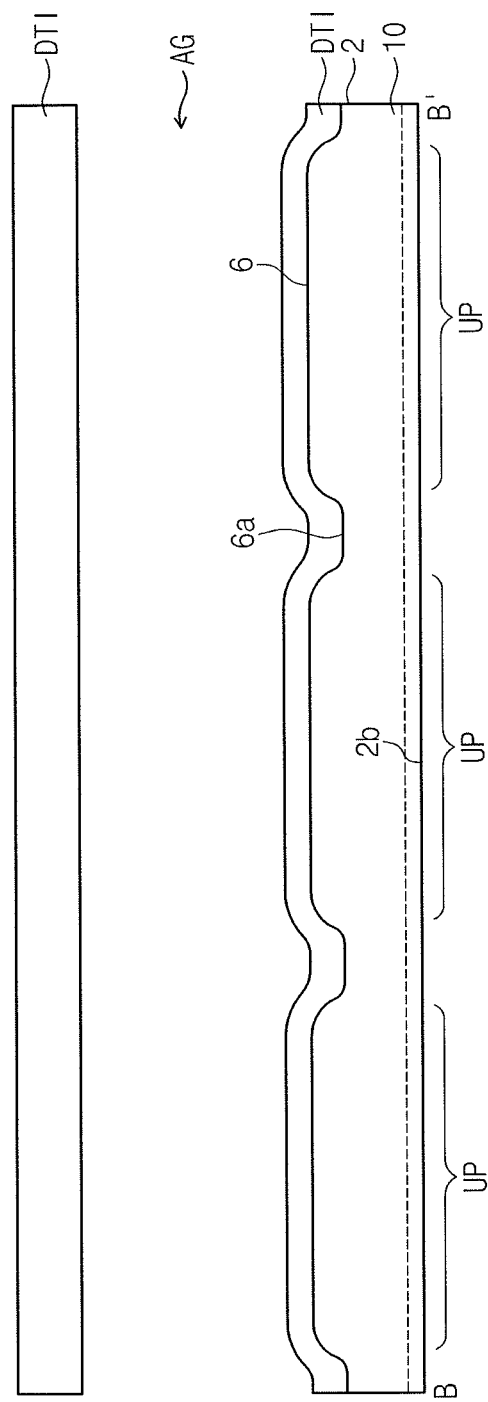
FIG. 13B illustrates a stage in a method of forming an image sensor having a cross-sectional view of FIG. 12B.

FIG. 13A illustrates stages in a method of forming an image sensor having a cross-sectional view of FIG. 12A. FIG. 13B illustrates stages in a method of forming an image sensor having a cross-sectional view of FIG. 12B.

Referring to FIGS. 13A and 13B, an insulating layer may be formed to fill the first and second trenches 4 and 6T illustrated in FIGS. 8A and 8B. At this time, the insulating layer is formed by a physical vapor deposition (PVD) process or a sputtering process having a poor step coverage characteristic. Thus, the air gap region AG may be formed.

Next, a planarization process may be performed on the insulating layer to a shallow device isolation layer STI and the deep device isolation layer DTI having the air gap region AG. Next, subsequent processes which are the same as/similar to corresponding processes of the first embodiment may be performed.

Figure 14A:
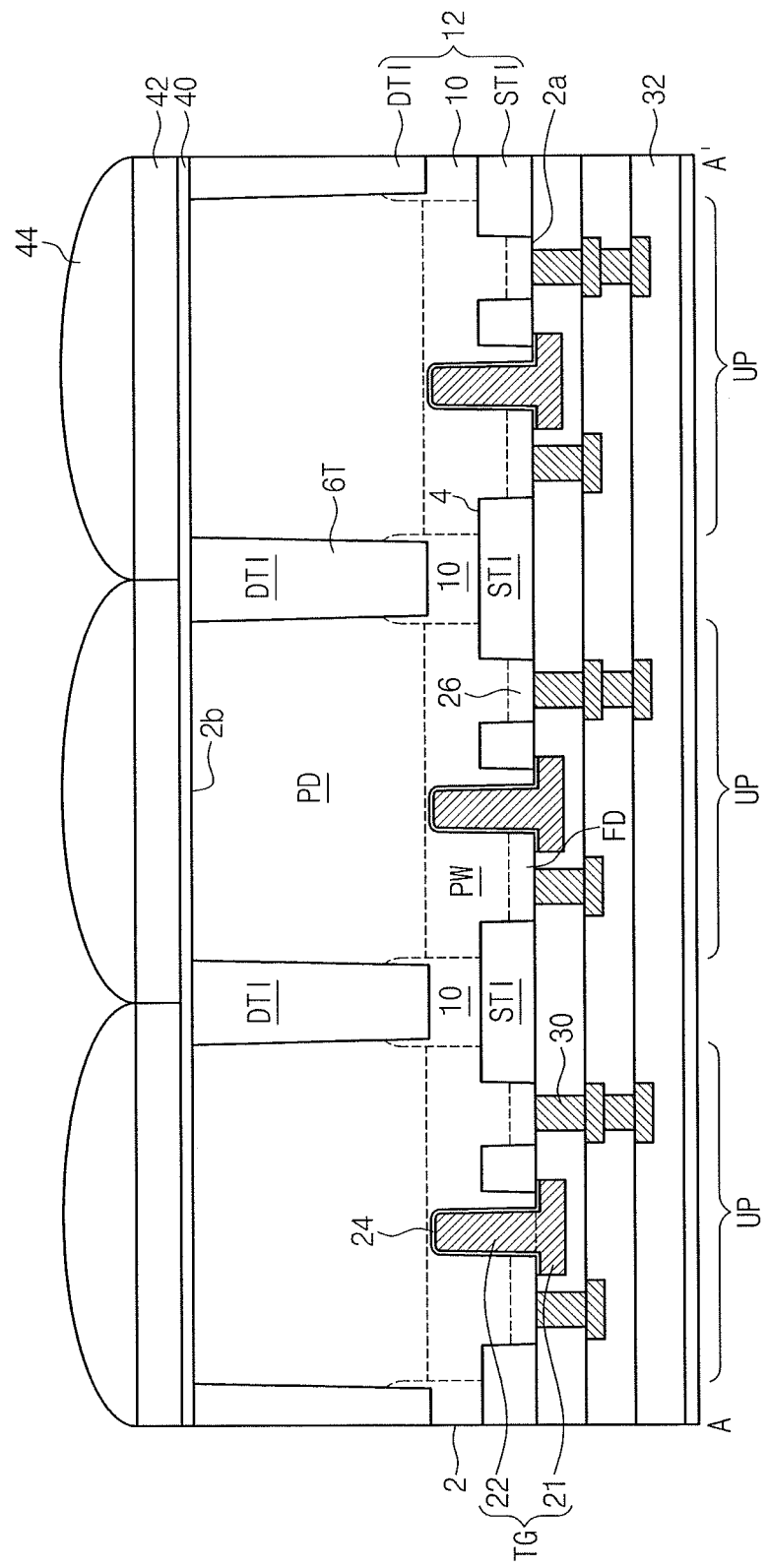
FIGS. 14A and 14B illustrate views along section lines A-A and B-B of FIG. 2.
Figure 14B:
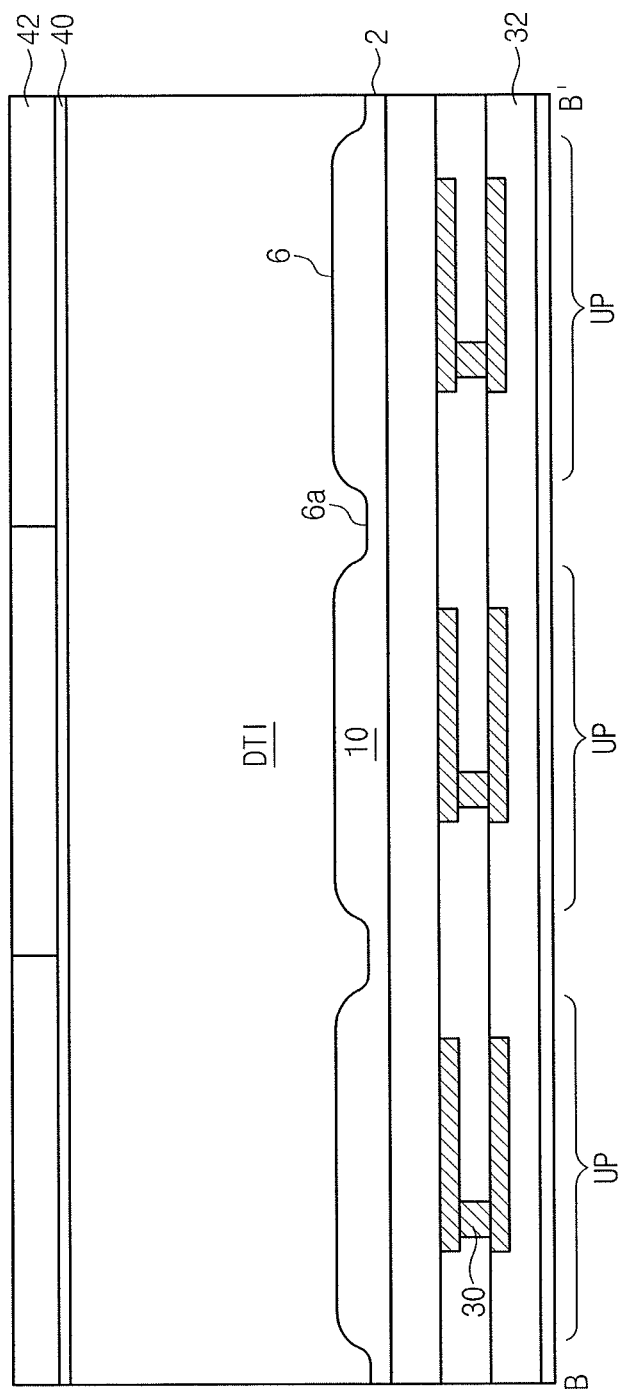

FIGS. 14A and 14B illustrate cross-sectional views respectively taken along lines A-A and B-B of FIG. 2 according to another embodiment. Referring to FIGS. 14A and 14B, a pixel isolation region 12 in an image sensor according to this embodiment may include a deep device isolation layer DTI, a channel stop region 10, and a shallow device isolation layer STI. The deep device isolation layer DTI may be in contact with the second surface 2b and may be spaced apart from the first surface 2a. The channel stop region 101 may be disposed between the shallow device isolation layer STI and the deep device isolation layer DTI. Other elements of the image sensor in the present embodiment may be the same as/similar to corresponding elements of the image sensor in the aforementioned embodiments.

FIGS. 15A to 19A illustrate stages in a method of forming an image sensor having a cross-sectional view of FIG. 14A. FIGS. 15B to 19B illustrate stages in a method of forming an image sensor having a cross-sectional view of FIG. 14B.

Figure 15A:
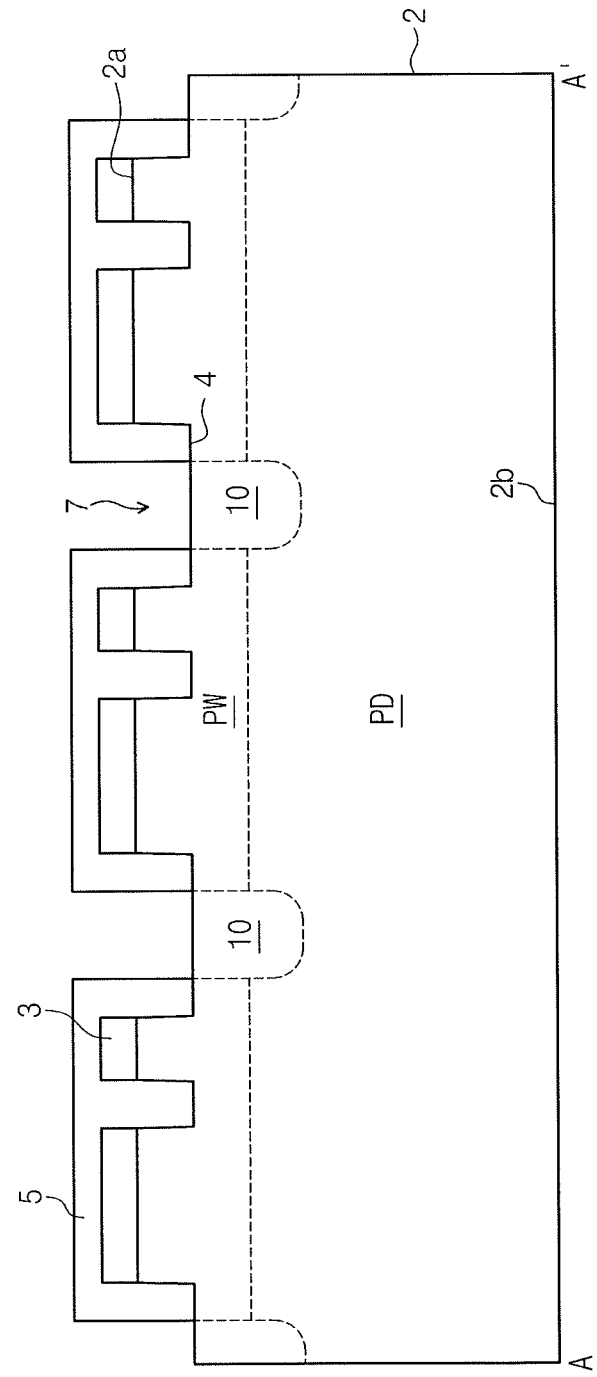
Figure 15B:
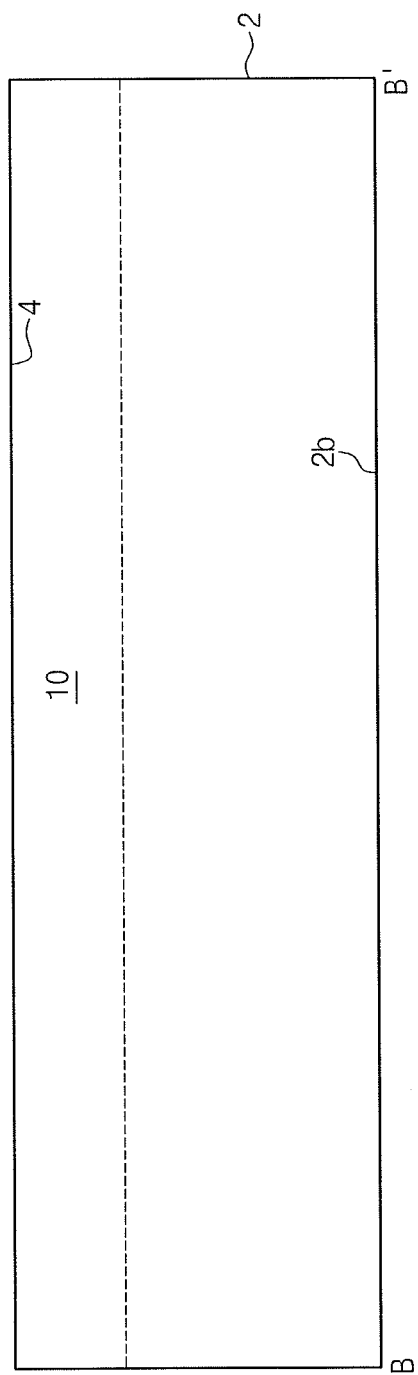

Referring to FIGS. 15A and 15B, a second mask pattern 5 covering the first mask pattern 3 and defining a channel stop region 10 may be formed on the structure illustrated in FIGS. 5A and 5B. Dopants may be injected using the second mask pattern 5 as an ion implantation mask into the substrate 2, thereby forming the channel stop region 10. The channel stop region 10 may be doped with, for example, P-type dopants.

Figure 16A:
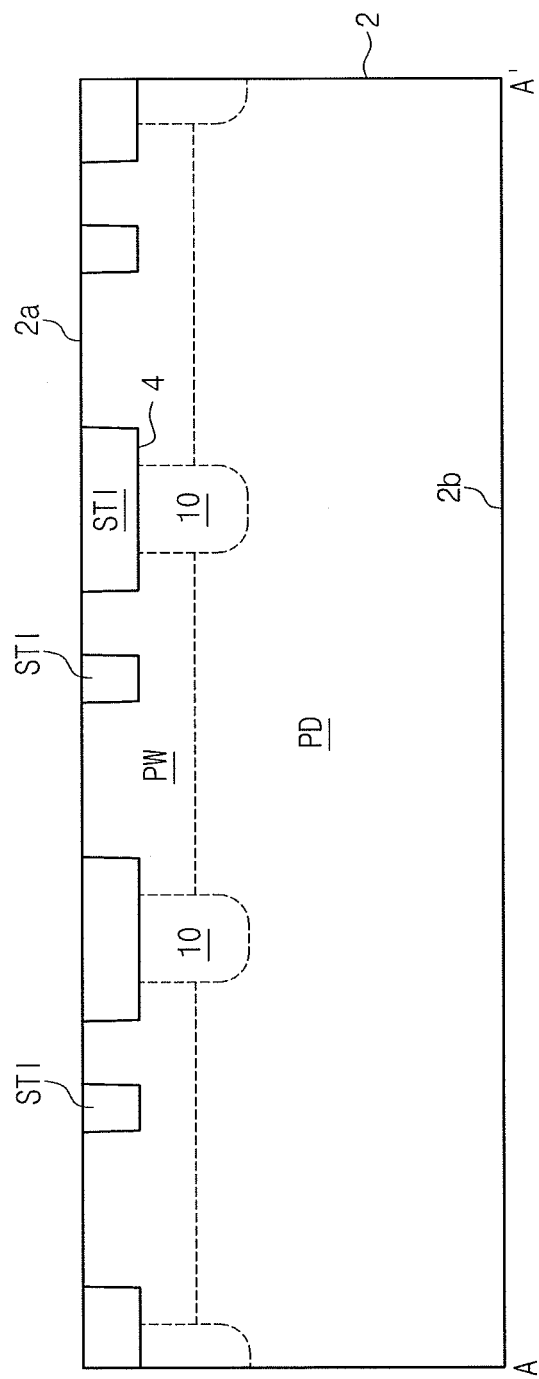
Figure 16B:
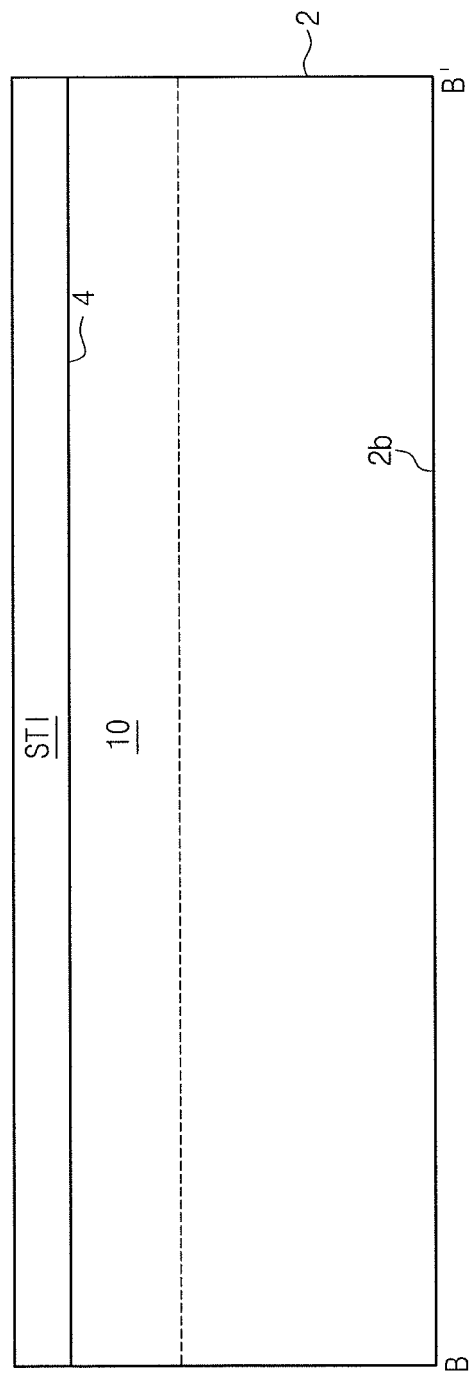

Referring to FIGS. 16A and 16B, the first and second mask patterns 3 and 5 may be selectively removed to expose the first trench 4. An insulating layer may be stacked on the substrate 2 to fill the first trench 4 and then a planarization process may be performed on the insulating layer to form a shallow device isolation layer STI.

Figure 17A:
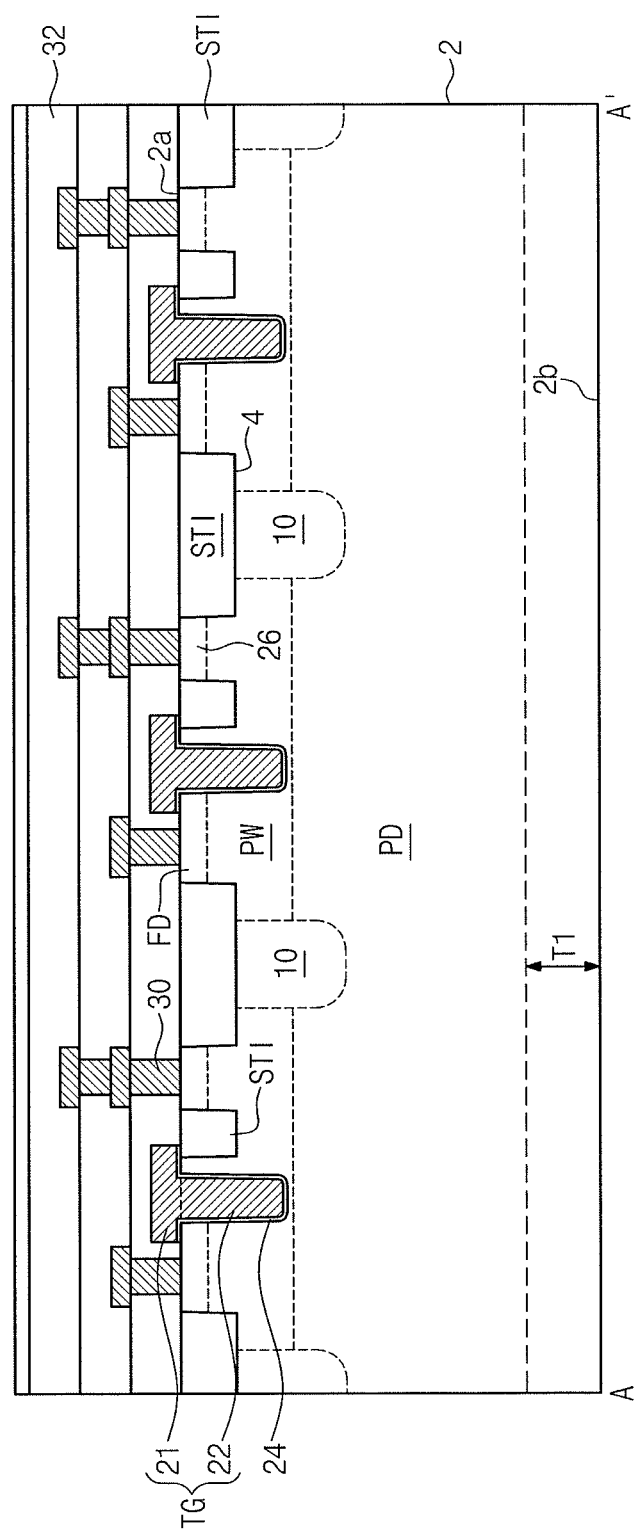
Figure 17B:
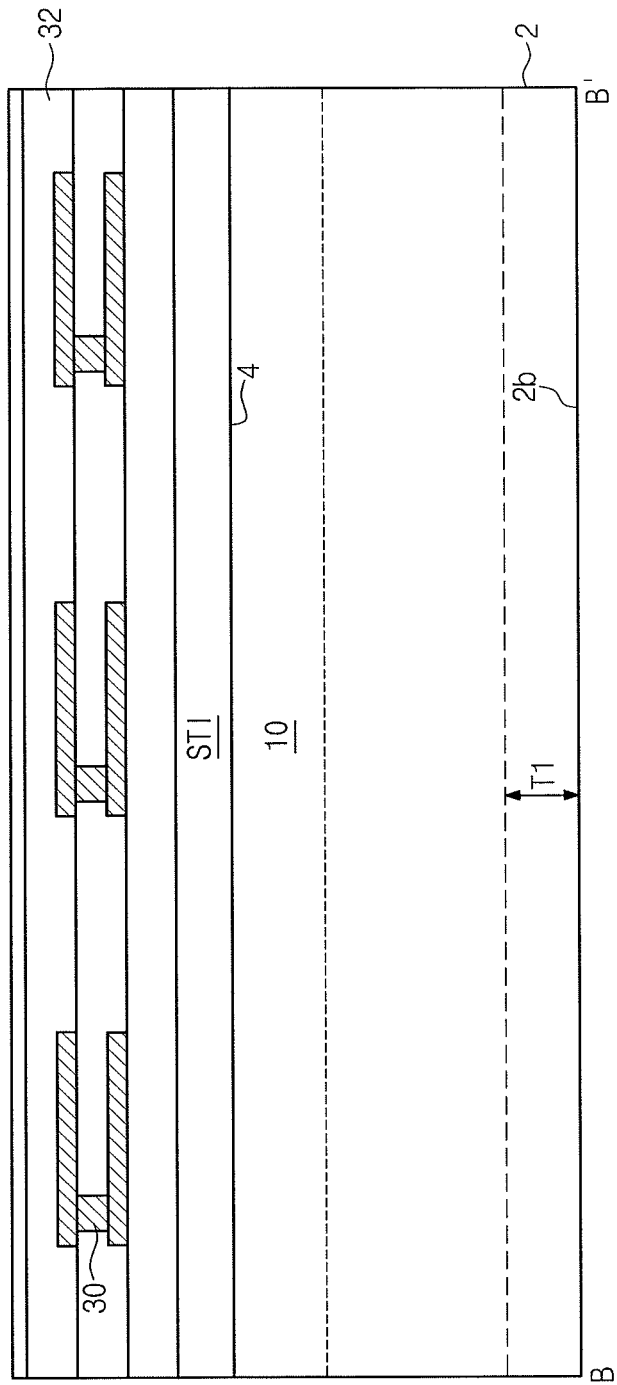
Figure 18A:
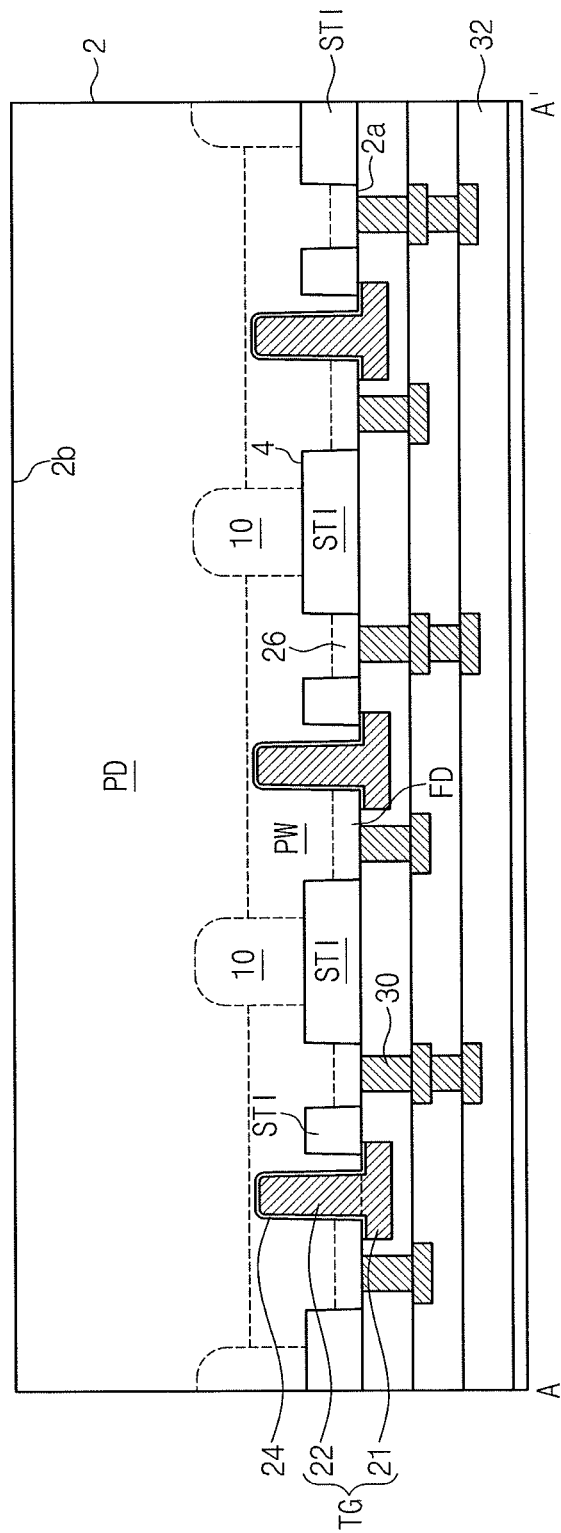

Referring to FIGS. 17A and 17B, a gate insulating layer 24, a transfer gate TG, a floating diffusion region FD, a ground impurity-doped region 26, contact-interconnections 30, and interlayer insulating layers 32 may be formed on the first surface 2a of the substrate 2, as described with reference to FIGS. 10A and 10B.

Referring to FIGS. 17A, 17B, 18A, and 18B, the substrate 2 may be overturned. Then, a grinding or CMP process may be performed to remove a portion having a first thickness T1 of the substrate 2 which is adjacent to the second surface 2b. At this time, since a deep device isolation layer DTI is not exposed during the grinding or CMP process, a surface flatness or uniformity of the substrate 2 may not be deteriorated and defects may be reduced.

Figure 19A:
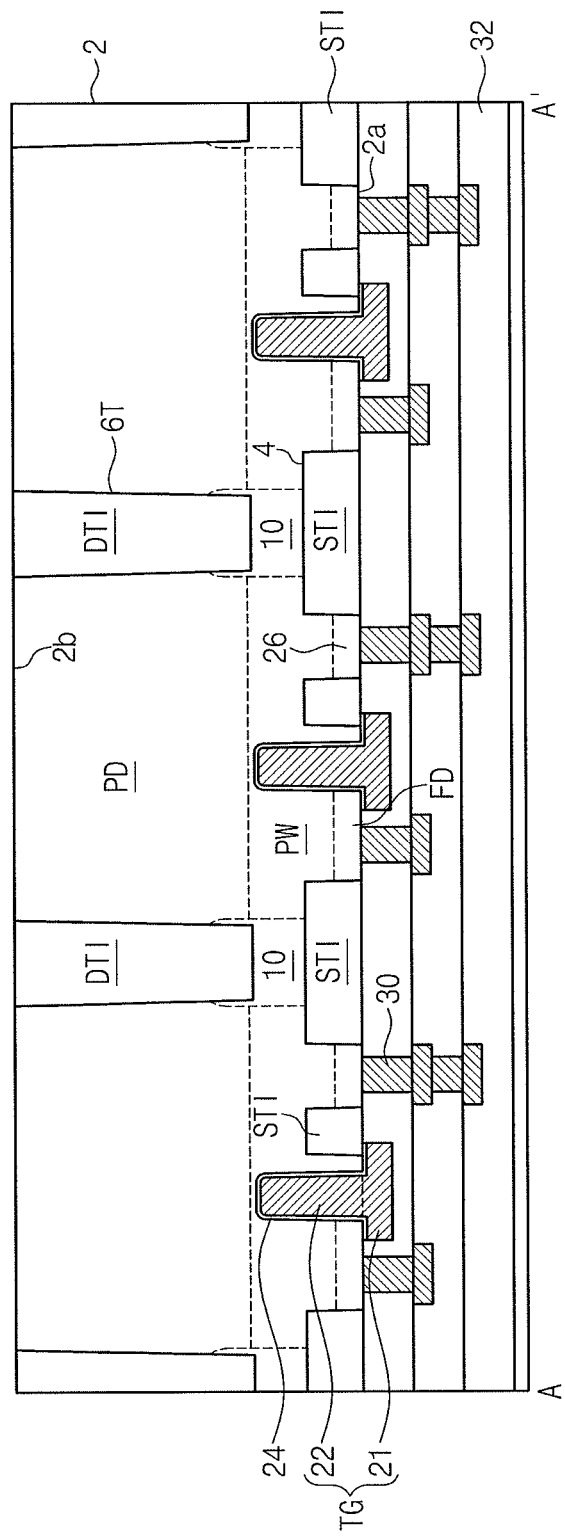

Referring to FIGS. 19A and 19B, the substrate 2 adjacent to the second surface 2b may be etched to form a second trench 6T exposing the channel stop region 10. An insulating layer may be formed to fill the second trench 6T and then may be planarized to form a deep device isolation layer DTI. Since the channel stop region 10 exists, a depth of the second trench 6T may be reduced. Thus, etch damage of the substrate 2 may be reduced. Next, subsequent processes which are the same as/similar to corresponding processes of the aforementioned embodiments may be performed.

Figure 20A:
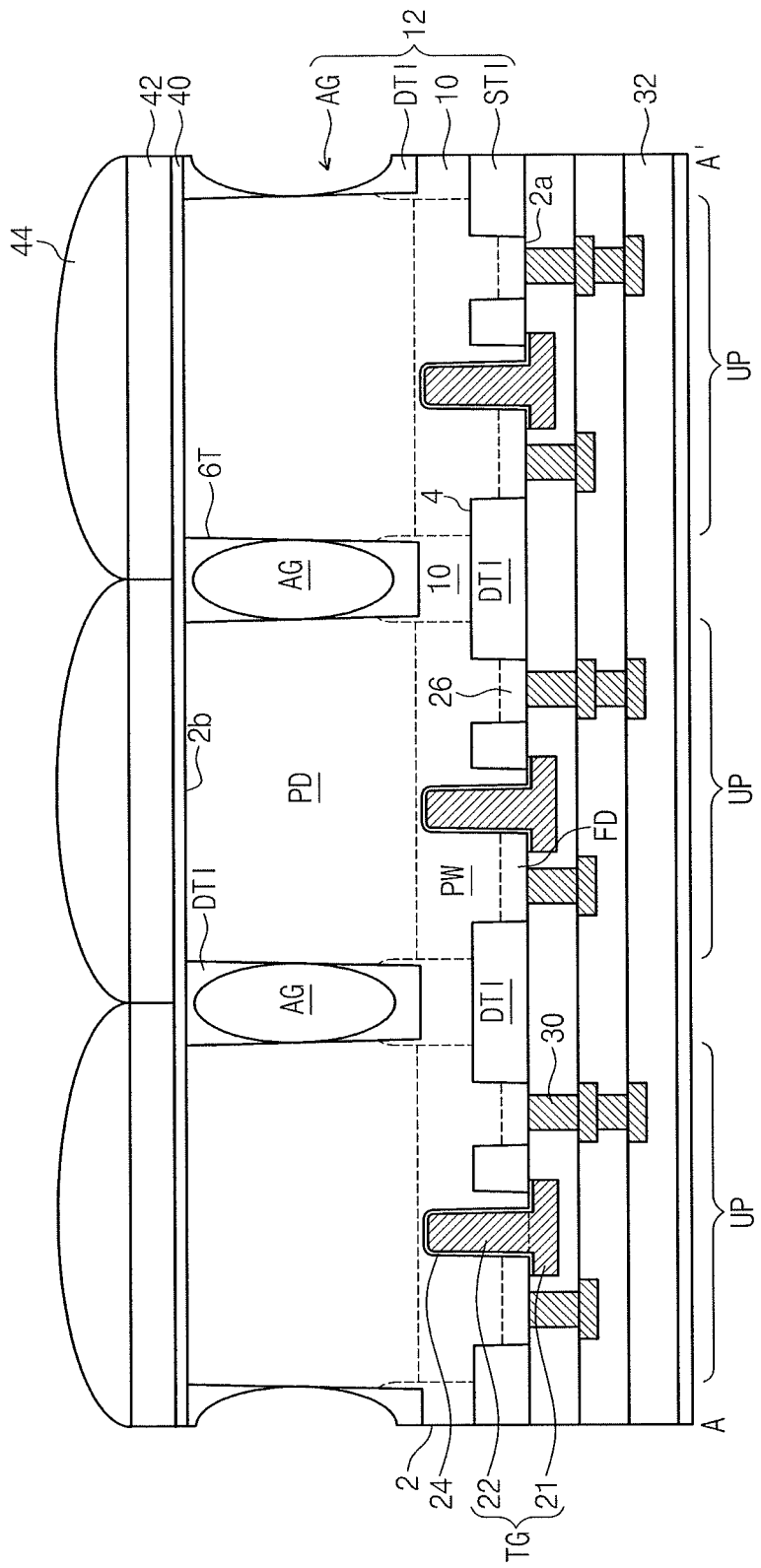
FIGS. 20A and 20B illustrate views along section lines A-A and B-B of FIG. 2.
Figure 20B:
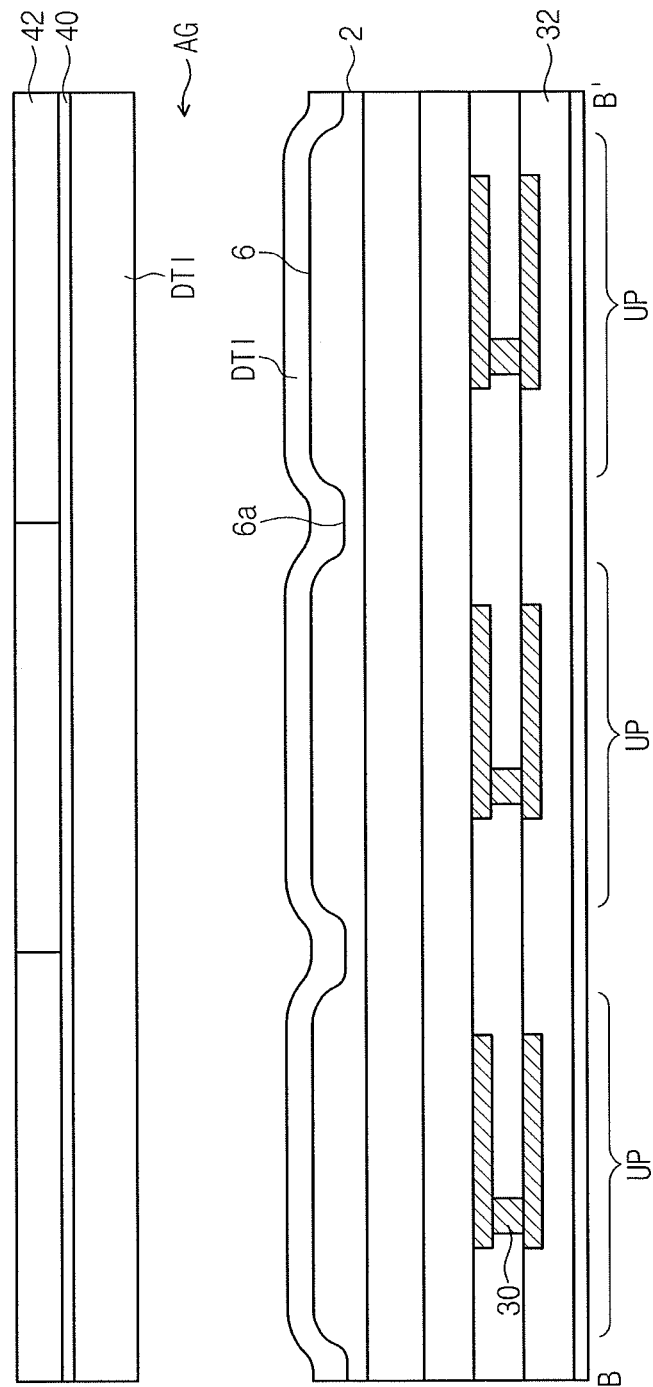

FIGS. 20A and 20B illustrate cross-sectional views respectively taken along lines A-A and B-B of FIG. 2 according to another embodiment. Referring to FIGS. 20A and 20B, an image sensor according to this embodiment may be similar to the image sensor of FIGS. 14A and 14B. However, an air gap region AG may be formed in the deep device isolation layer DTI. In other words, a pixel isolation region 12 of the image sensor according to the present embodiment may include the shallow device isolation layer STI, the channel stop region 10, the deep device isolation layer DTI, and the air gap region AG. Other elements of the image sensor in the present embodiment may be the same as/similar to corresponding elements of the image sensor in the previous embodiment.

Figure 21:
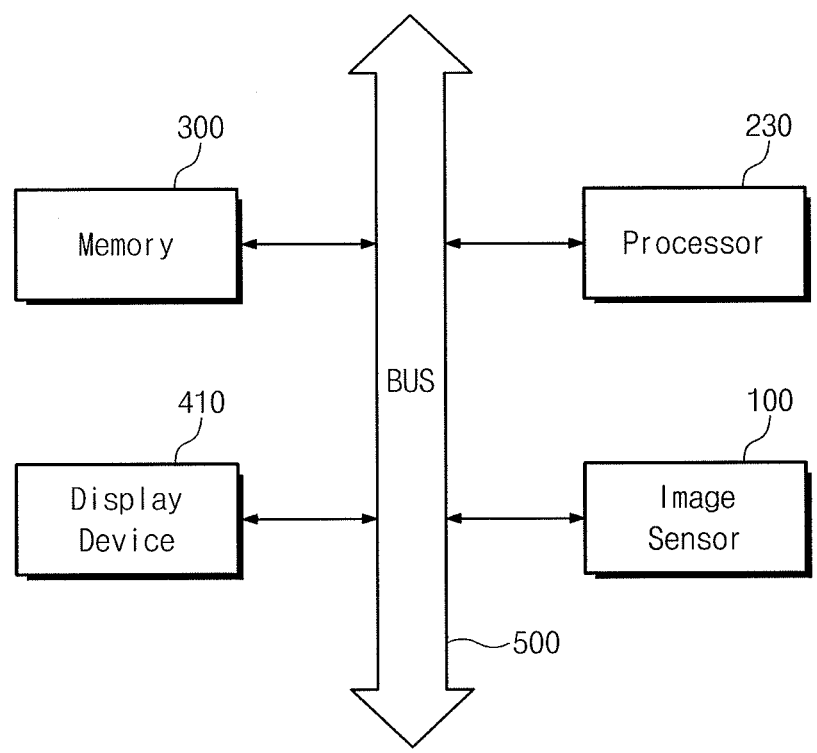
FIG. 21 illustrates an embodiment of an electronic device including an image sensor.
Figure 22:
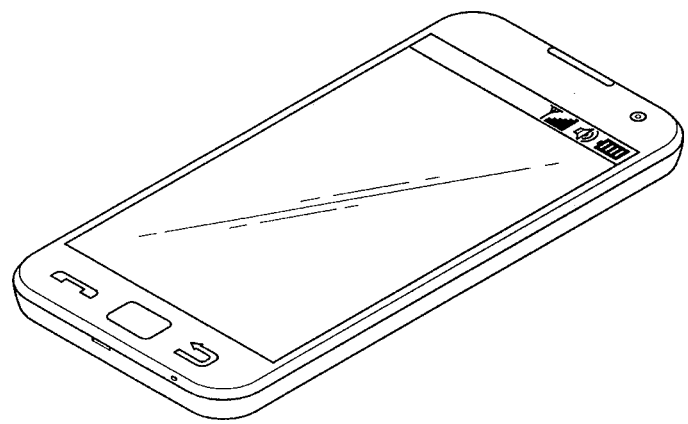
FIGS. 22 to 26 illustrate examples of a multimedia device including an image sensor.
Figure 23:
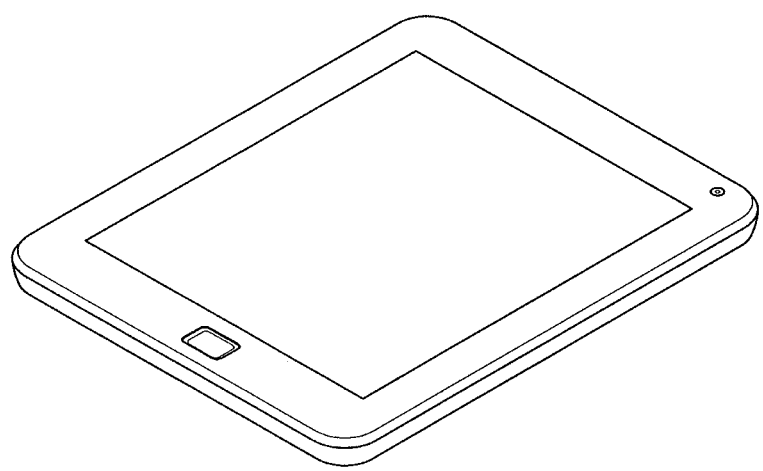
Figure 24:
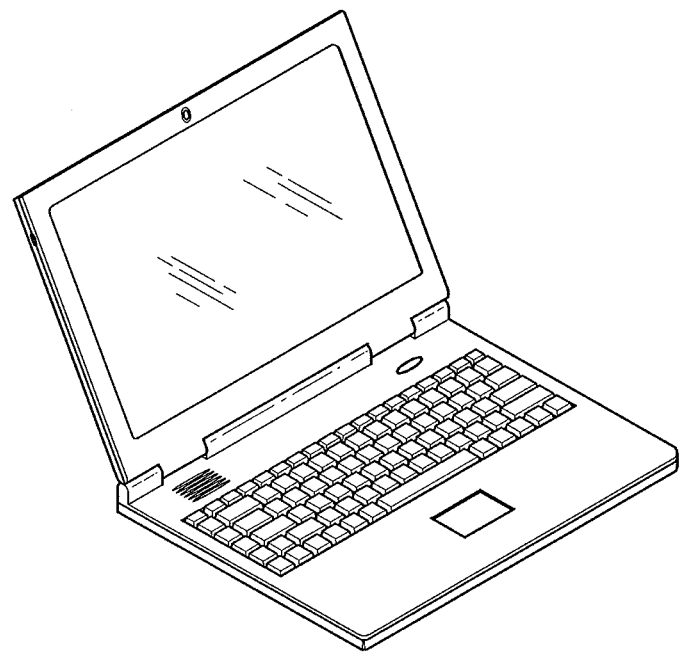
Figure 25:
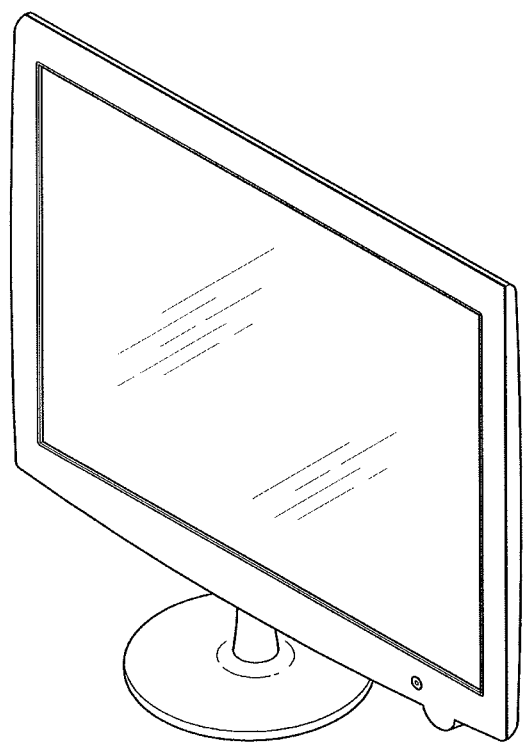
Figure 26:
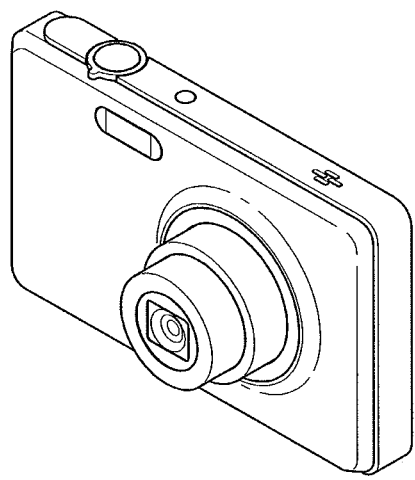

FIG. 21 illustrates an electronic device including an image sensor according to any of the aforementioned embodiments. The electronic device may be a digital camera or a mobile device. Referring to FIG. 21, a digital camera system may include an image sensor 100, a processor 230, a memory device 300, a display 410, and a bus unit 500. As illustrated in FIG. 21, the image sensor 100 may capture external image information in response to control of the processor 230. The processor 230 may store the captured image information in the memory device 300 through the bus unit 500. The processor 230 may output the image information stored in memory device 300 to the display 410.

FIGS. 22 to 26 illustrate examples of a multimedia device applied with an image sensor according to any of the aforementioned embodiments. The image sensors according to the aforementioned embodiments may be applied to various multimedia devices having an image photographing function. For example, the image sensors according to the aforementioned embodiments may be applied to a mobile or smart phone 2000 illustrated in FIG. 22 and/or a tablet or smart tablet 3000 illustrated in FIG. 23. Additionally, the image sensors according to the aforementioned embodiments may be applied to a notebook computer 4000 of FIG. 24 and/or a television or smart television 5000 of FIG. 25. Furthermore, the image sensors according to the aforementioned embodiments may be applied to a digital camera or digital camcorder 6000 illustrated in FIG. 26.

By way of summation and review, the pixel isolation region isolating the pixel regions from each other may include the deep device isolation layer and the channel stop region. If the pixel regions are isolated from each other by only the deep device isolation layer, uniformity of the surface of the substrate may be deteriorated by depth dispersion. Thus, a color ratio difference or defects of the surface of the substrate may be greatly increased. Additionally, the etched depth of the substrate may be increased to cause excessive etch damage of the substrate.

On the other hand, if the pixel regions are isolated from each other by only the channel stop region, a portion of the substrate in which dopants are injected may be increased to cause excessive damage and/or defects of the substrate. The etch damage and/or the defects may cause a dark current.

In accordance with one or more embodiments, the pixel isolation region includes the deep device isolation layer and the channel stop region. Thus, the uniformity of the surface of the substrate may be improved and the etch damage and the ion implantation damage may be suitably controlled. As a result, the dark current characteristic may be improved and the high-definition image sensor may be realized. Additionally, the pixel isolation region may be disposed from the bottom surface to the top surface of the substrate such that the cross-talk between the pixels may be completely prevented. Thus, an image lag phenomenon may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An image sensor comprising:
a substrate including a first surface opposing a second surface and a plurality of pixel regions, the second surface to receive incident light;
a photoelectric converter in each of the pixel regions;
a gate electrode on the photoelectric converter; and
a pixel isolation region isolating adjacent the pixel regions, wherein the pixel isolation region includes a first isolation layer coupled to a channel stop region, the first isolation layer includes a bottom surface adjacent to the second surface of the substrate and sidewalls extending toward the first surface of the substrate from the bottom surface of the first isolation layer,
wherein the channel stop region is an impurity-doped region, and
wherein the channel stop region is disposed between the bottom surface of the first isolation layer and the second surface of the substrate, and spaced apart from the sidewalls of the first isolation layer.

2. The image sensor as claimed in claim 1, wherein:
the first isolation layer contacts the first surface; and
the channel stop region contacts the second surface.

3. The image sensor as claimed in claim 2, further comprising:
a second isolation layer contacting the first surface, the second isolation layer being shallower than the first isolation layer.

4. The image sensor as claimed in claim 3, wherein the first isolation layer and the second isolation layer are integrally formed as one body.

5. The image sensor as claimed in claim 1, further comprising
an air gap region in the first isolation layer.

6. The image sensor as claimed in claim 1, wherein a bottom surface or a top surface opposing to the bottom surface of the first isolation layer is uneven.

7. The image sensor as claimed in claim 1, wherein:
the gate electrode is on the first surface, and
the image sensor further includes a color filter and a micro-lens on the second surface.

8. The image sensor as claimed in claim 1, wherein:
the photoelectric converter includes dopants of a first conductivity type, and
the channel stop region includes dopants of a second conductivity type.

9. An image sensor, comprising:
a plurality of pixel regions, each pixel region including a photoelectric converter and an active region, the photoelectric converter being a first material doped with impurities of a first type, the photoelectric converter having a first surface on which light is incident and a second surface adjacent the active region; and
a first separator between adjacent pixel regions, and
a second separator disposed between adjacent the pixel regions and vertically overlapped with the first separator, wherein the first separator includes a first surface, co-planar with the first surface of the photoelectric converter, made of the first material doped with impurities of a second type, wherein the second separator contacts a second surface of the first separator opposing to the first surface of the first separator, and wherein the first separator is spaced apart from sidewalls of the second separator.

10. The image sensor as claimed in claim 9, wherein a thickness of the first material doped with impurities of the second type is greater in a region in which only two pixel regions neighbor each other than in a region in which four pixel regions neighbor each other.

11. The image sensor as claimed in claim 9, wherein the second separator extends from adjacent the active region to the first material doped with impurities of the second type.

12. The image sensor as claimed in claim 11, wherein the second separator is wider adjacent the active region than adjacent the first material doped with impurities of the second type.

13. The image sensor as claimed in claim 11, wherein the second separator includes an insulating layer and an air gap surrounded by the insulating layer.

\* \* \* \* \*